US010858547B2

(12) United States Patent
Hayashishita

(10) Patent No.: US 10,858,547 B2
(45) Date of Patent: Dec. 8, 2020

(54) FILM FOR MANUFACTURING SEMICONDUCTOR PARTS

(71) Applicant: MITSUI CHEMICALS TOHCELLO, INC., Tokyo (JP)

(72) Inventor: Eiji Hayashishita, Nagoya (JP)

(73) Assignee: MITSUI CHEMICALS TOHCELLO, INC., Tokyo (JP)

(*) Notice: Subject to any disclaimer, the term of this patent is extended or adjusted under 35 U.S.C. 154(b) by 0 days.

(21) Appl. No.: 15/578,989

(22) PCT Filed: Jun. 14, 2016

(86) PCT No.: PCT/JP2016/067705
§ 371 (c)(1),
(2) Date: Dec. 1, 2017

(87) PCT Pub. No.: WO2017/002610
PCT Pub. Date: Jan. 5, 2017

(65) Prior Publication Data
US 2018/0142130 A1 May 24, 2018

(30) Foreign Application Priority Data
Jun. 29, 2015 (JP) .................................. 2015-130403

(51) Int. Cl.
*H01L 21/78* (2006.01)
*C09J 7/25* (2018.01)
(Continued)

(52) U.S. Cl.
CPC .................. *C09J 7/255* (2018.01); *C09J 7/20* (2018.01); *C09J 7/25* (2018.01); *C09J 7/30* (2018.01);
(Continued)

(58) Field of Classification Search
CPC ........ H01L 21/56; H01L 23/3107; C09J 7/20; C09J 201/00; B32B 27/04; B32B 27/08;
(Continued)

(56) References Cited

U.S. PATENT DOCUMENTS 10,017,670 B2  7/2018  Grisle et al.
2006/0220262 A1  10/2006  Meyer et al.
(Continued)

FOREIGN PATENT DOCUMENTS

EP  0369092 A2  5/1990
JP  2003-338535 A  11/2003
(Continued)

OTHER PUBLICATIONS

Kapton EN Catalogue, Du Pont-Toray Co., Ltd., May 2012, pp. 2, <http://www.td-net.co.jp/products/download/documents/1207kaptonEN.pdf>.
(Continued)

*Primary Examiner* — Mounir S Amer
*Assistant Examiner* — Alexander Belousov
(74) *Attorney, Agent, or Firm* — Buchanan Ingersoll & Rooney PC

(57) ABSTRACT

Provided is a film for manufacturing a semiconductor part in which an evaluation step accompanied with a temperature change, a segmenting step, and a pickup step can be commonly performed, a method for manufacturing a semiconductor part, a semiconductor part, and an evaluation method. The film includes a base layer, and an adhesive layer disposed on one surface side of the base layer, wherein the ratio RE (=E'(160)/E'(−40)) of the elastic modulus of the base layer at 160° C. to the elastic modulus of the base layer at −40° C. is RE≥0.01, and the elastic modulus E'(−40) is 10 MPa to less than 1000 MPa. The method includes bonding the adhesive layer to a back surface of a semiconductor
(Continued)

wafer, separating the semiconductor wafer into segments to obtain semiconductor parts, and separating the semiconductor parts from the adhesive layer, and includes a step of evaluating.

10 Claims, 7 Drawing Sheets

(51) Int. Cl.
　　　C09J 201/00　　(2006.01)
　　　C09J 7/20　　(2018.01)
　　　C09J 7/30　　(2018.01)
　　　C09J 133/08　　(2006.01)
　　　C09J 133/12　　(2006.01)
　　　H01L 21/683　　(2006.01)

(52) U.S. Cl.
　　　CPC ......... *C09J 133/08* (2013.01); *C09J 133/12* (2013.01); *C09J 201/00* (2013.01); *H01L 21/6836* (2013.01); *H01L 21/78* (2013.01); *C09J 2203/326* (2013.01); *C09J 2301/502* (2020.08); *C09J 2433/00* (2013.01); *C09J 2467/006* (2013.01); *C09J 2477/006* (2013.01)

(58) Field of Classification Search
　　　CPC ... B32B 27/281; B32B 27/283; B32B 27/308; B32B 27/36; B32B 2307/306; B32B 307/54; B32B 2405/00; B32B 2457/14
　　　See application file for complete search history.

(56) References Cited

U.S. PATENT DOCUMENTS

| | | |
|---|---|---|
| 2010/0300612 A1 | 12/2010 | Yamamoto et al. |
| 2012/0309170 A1* | 12/2012 | Hayashishita ...... H01L 21/6836 438/464 |
| 2015/0020961 A1 | 1/2015 | Grisle et al. |

FOREIGN PATENT DOCUMENTS

| | | |
|---|---|---|
| JP | 2006-287235 A | 10/2006 |
| JP | 2007-005436 A | 1/2007 |
| JP | 2009-057394 A | 3/2009 |
| JP | 2010-278065 A | 12/2010 |
| JP | 2011-082480 A | 4/2011 |
| JP | 2012-062372 A | 3/2012 |
| JP | 2013-023684 A | 2/2013 |
| WO | 2006/038438 A3 | 4/2006 |
| WO | 2013/134000 A1 | 9/2013 |
| WO | WO 2015/033867 A1 | 3/2015 |

OTHER PUBLICATIONS

Nenchakusei Hyoka Gijutsu, Nitto Denko Corporation, Jan. 23, 2014, pp. 1-4, <http://www.nitto.com/jp/ja/rd/base/analyze/adhesion/>.

International Search Report (PCT/ISA/210) dated Sep. 6, 2016, by the Japanese Patent Office as the International Searching Authority for International Application No. PCT/JP2016/067705.

Written Opinion (PCT/ISA/237) dated Sep. 6, 2016, by the Japanese Patent Office as the International Searching Authority for International Application No. PCT/JP2016/067705.

International Search Report (PCT/ISA/210) dated Aug. 23, 2016, by the Japanese Patent Office as the International Searching Authority for International Application No. PCT/JP2016/067090.

Written Opinion (PCT/ISA/237) dated Aug. 23, 2016, by the Japanese Patent Office as the International Searching Authority for International Application No. PCT/JP2016/067090.

Office Action issued by the Taiwanese Patent Office in corresponding Taiwanese Patent Application No. 105119094 dated Jun. 4, 2019 (13 pages including partial English translation).

Extended Search Report issued by the European Patent Office in corresponding European Patent Application No. 16817719.4-1102 dated Feb. 13, 2019 (6 pages).

* cited by examiner

FILM FOR MANUFACTURING SEMICONDUCTOR PARTS

TECHNICAL FIELD

The present invention relates to a film for manufacturing a semiconductor part, a method for manufacturing a semiconductor part, a film for manufacturing an electron device, and a method for manufacturing an electronic device. More particularly, the present invention relates to a film for manufacturing a semiconductor part which in manufacturing a semiconductor part from a semiconductor wafer, is bonded to a back surface of the semiconductor wafer to be used, a method for manufacturing a semiconductor part, a film for manufacturing an electron device which in manufacturing an electronic device from an array-shaped electronic device, is bonded to a back surface of the array-shaped electronic device to be used, and a method for manufacturing an electronic device.

BACKGROUND ART

In recent years, a method is used in which after a wafer having circuits formed thereon is separated into segments, the resulting semiconductor parts are evaluated (inspected), only semiconductor parts passing the evaluation are rearranged on a carrier, and sealed in the form of an array with a sealant, and thereby, semiconductor parts are manufactured collectively to realize a high yield. This type of a manufacturing method is disclosed in the following Patent Literature 1 (refer to FIG. 3A to FIG. 3E, paragraphs [0028] and [0029]).

Further, the following Patent Literature 2 discloses an adhesive film which can be used in separating a wafer having circuits formed thereon into segments. Further, the following Patent Literature 3 discloses an adhesive film which can be used in sealing the semiconductor part.

CITATIONS LIST

Patent Literatures

Patent Literature 1: JP 2006-287235 A
Patent Literature 2: JP 2007-005436 A
Patent Literature 3: JP 2010-278065 A

SUMMARY OF INVENTION

Technical Problems

Patent Literature 1 describes an outline that excellent dies (semiconductor parts formed by separating a wafer into segments) passing an evaluation at an initial stage are arranged on an adhesive part of a peelable adhesive tape so as to have sufficient space therebetween. However, Patent Literature 1 does not specifically refer to what equipment and material are used to realize the outline. Of the above-mentioned methods, as a "peelable adhesive tape", an adhesive film disclosed in Patent Literature 3 can be used.

On the other hand, the above-mentioned outline can be performed, for example, by using, as a prior step, a procedure (1) in which a semiconductor wafer (pre-segmentation) is placed on a dedicated tray and evaluated in the form of a wafer, and to a back surface (non-circuit surface) of the wafer passing the evaluation, an adhesive film disclosed in Patent Literature 2 is bonded, thereafter the wafer is separated into segments (diced) to obtain semiconductor parts, the semiconductor parts are picked up from the adhesive film, and only semiconductor parts passing the evaluation are rearranged on an adhesive film disclosed in Patent Literature 3.

Further, the outline can be performed, for example, by using a procedure (2) in which to a back surface (non-circuit surface) of a pre-evaluation semiconductor wafer (pre-segmentation), an adhesive film disclosed in Patent Literature 2 is bonded, thereafter the semiconductor wafer is separated into segments (diced) to obtain semiconductor parts, the semiconductor parts are picked up from the adhesive film, then the semiconductor parts are rearranged on a dedicated tray to be evaluated, and only semiconductor parts passing the evaluation are rearranged on an adhesive film disclosed in Patent Literature 3.

In either case, the above-mentioned procedures (1) and (2) have a problem that it is necessary to do a work of changing a film between a plurality of adhesive films and bonding the changed film to the semiconductor part.

Furthermore, in the above inspection, sometimes an operational evaluation of evaluating whether a semiconductor wafer or a semiconductor part is normally operated under a heated or cooled environment, or an accelerated evaluation in which a load of thermal stress is added, is made. That is, the semiconductor part is formed by forming very many items on a semiconductor wafer, and then separating the semiconductor wafer into segments. When a failure rate of the semiconductor part is measured, measurement values of the failure rate forms a curve referred to as a bathtub curve, and it is known that a rate of "initial failure", which occurs early after the beginning of actual operation, is relatively high. Therefore, a technique in which a yield of an end product is improved by rejecting the semiconductor part of concern for the initial failure at a more precedent step without being brought into a subsequent step, is used.

Then, as described above, sometimes heating or cooling is performed in the evaluation. That is, there may be cases where an electric evaluation is made in a state of maintaining a low temperature, an electric evaluation is made in a state of maintaining a high temperature, or the evaluation is made under an environment of both of low temperature and high temperature. It is preferred to make an evaluation at a more posterior step from the viewpoint of not bringing a defective product into a subsequent step to reduce a defective rate at the subsequent step. On the other hand, there is a fear that a man-hour is rather increased by interposing the evaluation step to reduce the productivity.

From such a balance, an adhesive film capable of giving such flexibility that an order of steps suitable for each product can be freely selected without depending on the performance of the adhesive film, is required. That is, even though the adhesive film is exposed to large changes in temperature in the evaluation step, in segmenting (dicing) and picking up the semiconductor wafer, the adhesive film capable of dealing with such works is required. That is, an adhesive film in which the evaluation step, the segmenting step and the pickup step can be performed on the same film, is required.

The present invention was made in view of the aforementioned problem, and it is an object of the present invention to provide a film for manufacturing a semiconductor part in which an evaluation step accompanied with a temperature change, a segmenting step, and a pickup step can be commonly performed and a method for manufacturing a semiconductor part, as well as a film for manufacturing an electronic device in which an evaluation step accompanied with a temperature change, a segmenting step, and a pickup step can be commonly performed and a method for manufacturing an electronic device.

Solutions to Problems

The present invention includes the following items.

[1] A film for manufacturing a semiconductor part used in a method for manufacturing a semiconductor part including:
a base layer; and an adhesive layer disposed on one surface side of the base layer, wherein the ratio $R_E$ (=E'(160)/E'(-40)) of the elastic modulus E'(160) of the base layer at 160° C. to the elastic modulus E'(-40) of the base layer at -40° C. is such that $R_E \geq 0.01$, and the elastic modulus E'(-40) is 10 MPa or more and less than 1000 MPa.

[2] The film for manufacturing a semiconductor part according to the above [1], wherein the base layer includes a thermoplastic polyester-based elastomer and/or a thermoplastic polyamide-based elastomer.

[3] The film for manufacturing a semiconductor part according to the above [1] or [2], wherein the base layer has a thickness of 50 μm or more and 200 μm or less.

[4] The film for manufacturing a semiconductor part according to any one of the above [1] to [3], wherein the adhesive layer has a thickness of 1 μm or more and 40 μm or less.

[5] The film for manufacturing a semiconductor part according to any one of the above [1] to [4], wherein the adhesive layer has an adhesive force of 0.1 to 10 N/25 mm which is measured according to JIS Z 0237.

[6] The film for manufacturing a semiconductor part according to any one of the above [1] to [5], wherein the method for manufacturing a semiconductor part includes: a segmenting step of separating a semiconductor wafer into segments in a state in which the adhesive layer is bonded to a back surface of the semiconductor wafer having circuits formed thereon to obtain semiconductor parts; and
a pickup step of separating the semiconductor parts from the adhesive layer; and
the method includes an evaluation step of evaluating the semiconductor wafer or the semiconductor parts in a temperature region of 0° C. or lower, or 100° C. or higher prior to the pickup step.

[7] A method for manufacturing a semiconductor part including:
a segmenting step of separating a semiconductor wafer into segments in a state in which an adhesive layer of a film for manufacturing a semiconductor part is bonded to a back surface of the semiconductor wafer having circuits formed thereon to obtain semiconductor parts; and
a pickup step of separating the semiconductor parts from the adhesive layer; and
the method including an evaluation step of evaluating the semiconductor wafer or the semiconductor parts in a temperature region of 0° C. or lower, or 100° C. or higher prior to the pickup step,
wherein the film for manufacturing a semiconductor part has a base layer and the adhesive layer disposed on one surface side of the base layer, and
wherein the ratio $R_E$ (=E'(160)/E'(-40)) of the elastic modulus E'(160) of the base layer at 160° C. to the elastic modulus E'(-40) of the base layer at -40° C. is such that $R_E \geq 0.01$, and the elastic modulus E'(-40) is 10 MPa or more and less than 1000 MPa.

[8] The method for manufacturing a semiconductor part according to the above [7], wherein the base layer includes a thermoplastic polyester-based elastomer and/or a thermoplastic polyamide-based elastomer.

[9] The method for manufacturing a semiconductor part according to the above [7] or [8], wherein the base layer has a thickness of 50 μm or more and 200 μm or less.

[10] The method for manufacturing a semiconductor part according to any one of the above [7] to [9], wherein the adhesive layer has a thickness of 1 μm or more and 40 μm or less.

[11] The method for manufacturing a semiconductor part according to any one of the above [7] to [10], wherein the adhesive layer has an adhesive force of 0.1 to 10 N/25 mm which is measured according to JIS Z 0237.

[12] A film for manufacturing an electronic device used in a method for manufacturing an electronic device including:
a base layer and an adhesive layer disposed on one surface side of the base layer,
wherein the ratio $R_E$ (=E'(160)/E'(-40)) of the elastic modulus E'(160) of the base layer at 160° C. to the elastic modulus E'(-40) of the base layer at -40° C. is such that $R_E \geq 0.01$, and the elastic modulus E'(-40) is 10 MPa or more and less than 1000 MPa.

[13] The film for manufacturing an electronic device according to the above [12], wherein the base layer includes a thermoplastic polyester-based elastomer and/or a thermoplastic polyamide-based elastomer.

[14] The film for manufacturing an electronic device according to the above [12] or [13], wherein the base layer has a thickness of 50 μm or more and 200 μm or less.

[15] The film for manufacturing an electronic device according to any one of the above [12] to [14], wherein the adhesive layer has a thickness of 1 μm or more and 40 μm or less.

[16] The film for manufacturing an electronic device according to any one of the above [12] to [15], wherein the adhesive layer has an adhesive force of 0.1 to 10 N/25 mm which is measured according to JIS Z 0237.

[17] The film for manufacturing an electronic device according to any one of the above [12] to [16], wherein the method for manufacturing an electronic device includes:
a segmenting step of separating an array-shaped electronic device into segments in a state in which the adhesive layer is bonded to a back surface of the array-shaped electronic device provided with semiconductor parts sealed in an array configuration to obtain electronic devices; and
a pickup step of separating the electronic devices from the adhesive layer, and
the method includes an evaluation step of evaluating the array-shaped electronic device or the electronic device in a temperature region of 0° C. or lower, or 100° C. or higher prior to the pickup step.

[18] A method for manufacturing an electronic device including:
a segmenting step of separating an array-shaped electronic device into segments in a state in which an adhesive layer of a film for manufacturing a part is bonded to a back surface of the array-shaped electronic device provided with semiconductor parts sealed in an array configuration to obtain electronic devices; and
a pickup step of separating the electronic devices from the adhesive layer; and
the method including an evaluation step of evaluating the array-shaped electronic device or the electronic device in a temperature region of 0° C. or lower, or 100° C. or higher prior to, the pickup step,
wherein the film for manufacturing an electronic device has a base layer and the adhesive layer disposed on one surface side of the base layer, and wherein the ratio $R_E$ (=E'(160)/E'(−40)) of the elastic modulus E'(160) of the base layer at 160° C. to the elastic modulus E'(−40) of the base layer at −40° C. is such that $R_E \geq 0.01$, and the elastic modulus E'(−40) is 10 MPa or more and less than 1000 MPa.

[19] The method for manufacturing an electronic device according to the above [18], wherein the base layer includes a thermoplastic polyester-based elastomer and/or a thermoplastic polyamide-based elastomer.

[20] The method for manufacturing an electronic device according to the above [18] or [19], wherein the base layer has a thickness of 50 μm or more and 200 μm or less.

[21] The method for manufacturing an electronic device according to any one of the above [18] to [20], wherein the adhesive layer has a thickness of 1 μm or more and 40 μm or less.

[22] The method for manufacturing an electronic device according to any one of the above [18] to [21], wherein the adhesive layer has an adhesive force of 0.1 to 10 N/25 mm which is measured according to JIS Z 0237.

Advantageous Effects of Invention

According to the film for manufacturing a semiconductor part of the present invention, the evaluation step accompanied with a temperature change, the segmenting step, and the pickup step can be commonly performed. Therefore, a semiconductor part having excellent productivity can be manufactured.

According to the method for manufacturing a semiconductor part of the present invention, productivity is excellent because it is possible to use a film for manufacturing a semiconductor part common to the evaluation step accompanied with a temperature change, the segmenting step and the pickup step.

According to the film for manufacturing an electronic device of the present invention, the evaluation step accompanied with a temperature change, the segmenting step, and the pickup step can be commonly performed. Therefore, an electronic device having excellent productivity can be manufactured.

According to the method for manufacturing an electronic device of the present invention, productivity is excellent because it is possible to use a film for manufacturing an electronic device common to the evaluation step accompanied with a temperature change, the segmenting step and the pickup step.

DESCRIPTION OF EMBODIMENTS

Hereinafter, the present invention will be described with reference to drawings. Subjects shown herein are illustrative one and one for describing embodiments of the present invention exemplarily, and are described for the purpose of providing one believed to be explanation in which the principles and conceptual characteristics of the invention can be understood most effectively and without any difficulty. In this point, the embodiments are necessary for fundamental comprehension of the present invention and how some embodiments of the present invention are embodied in practice is clearly shown to those skilled in the art by an explanation in connection with drawings without intending to indicate a structural detail of the present invention above a certain level.

[1] Film for Manufacturing Semiconductor Part

Figure 1:
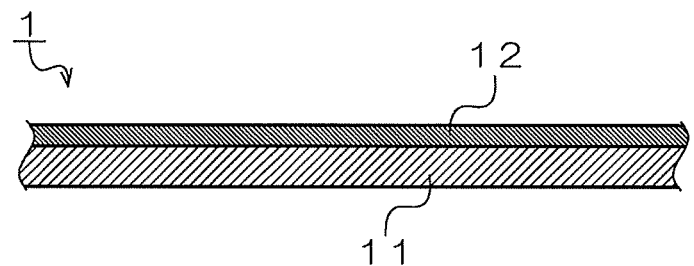
FIG. 1 is an illustrative drawing explaining a cross-section of an example of the present film for manufacturing a semiconductor part.

A film 1 for manufacturing a semiconductor part of the present invention is a film used in a method for manufacturing a semiconductor part. The film 1 for manufacturing a semiconductor part includes a base layer 11 and an adhesive layer 12 (refer to FIG. 1). The adhesive layer 12 may be disposed on at least one surface side of the base layer 11 or may be disposed on both of one surface side and the other surface side of the base layer 11 as required. Further, the base layer 11 and the adhesive layer 12 may be in direct contact with each other, or may be in contact with each other with another layer interposed between the base layer 11 and the adhesive layer 12.

(1) Base Layer

In the base layer 11, the ratio $R_E$ (=E'(160)/E'(−40)) of the tensile elastic modulus E'(160) at 160° C. to the tensile elastic modulus E'(−40) at −40° C. is such that $R_E \geq 0.01$, and E'(−40) is 10 MPa or more and less than 1000 MPa.

Herein, "E'(160)" represents the tensile elastic modulus of the base layer 11 at 160° C., and "E'(−40)" represents the tensile elastic modulus of the base layer 11 at −40° C. Furthermore, the ratio $R_E$ represents a ratio (E'(160)/E'(−40)) of the E'(160) to the E'(−40).

Accordingly, the ratio $R_E$ being such that $R_E \geq 0.01$ means that the tensile elastic modulus of the base layer 11 at 160° C. is 1% or more of the tensile elastic modulus of the base layer 11 at −40° C. The ratio $R_E$ may be such that $R_E \geq 0.01$, and is preferably such that $0.01 \leq R_E \leq 0.5$, more preferably $0.01 \leq R_E \leq 0.3$, and particularly preferably $0.02 \leq R_E \leq 0.2$.

In the film 1 for manufacturing a semiconductor part of the present invention, the characteristic that $R_E$ of the base layer 11 is such that $R_E \geq 0.01$ enables for the film 1 for manufacturing a semiconductor part to maintain required flexibility in the subsequent pickup step even though an evaluation step of evaluating a semiconductor wafer or a semiconductor part is performed in a low-temperature region of −40° C. or higher and 0° C. or lower, and/or a high-temperature region of 100° C. or higher and 160° C. or lower during manufacturing a semiconductor part. Accordingly, the present film 1 for manufacturing a semiconductor part can be used commonly in the evaluation step accompanied with a temperature change, the segmenting step and the pickup step and does not need to be changed to an adhesive film specific to every step for rebonding, and therefore the present film 1 is excellent in the productivity of a semiconductor part.

In addition to this, since either the above evaluation step or the above segmenting step can be performed while bonding the present film 1 for manufacturing a semiconductor part, any of these steps can be performed first, and flexibility of a step can be enhanced compared with the case of using a specific adhesive film or tray.

Further, E'(−40) is such that 100 MPa≤E'(−40)≤1000 MPa. In the film 1 for manufacturing a semiconductor part of the present invention, the characteristic that E'(−40) of the base layer 11 is such that 100 MPa≤E'(−40)≤1000 MPa enables to maintain the flexibility of the film for manufacturing a semiconductor part in low-temperature environments.

For example, sometimes the film 1 for manufacturing a part is used as a protecting member 15 accompanied with a frame (ring frame, etc.) 7 as described later. In the evaluation steps (refer to R3 in FIG. 4, R5 in FIG. 6, R3 in FIG. 9 and R5 in FIG. 11), an article to be evaluated (semiconductor wafer 20, semiconductor part 21, array-shaped electronic device 50, electronic device 51) is subjected to an evaluation with a back surface of the article bonded to the adhesive layer 12 of the film 1 for manufacturing a part fixed to a protecting member 15. On this evaluation, in order to avoid contact between parts on measuring equipment side such as the probe card 80 and the frame 7, a vacuum chuck table (not shown) and an instrument such as a stopper 91 are placed inside the frame 7, and the frame 7 is pressed downward (e.g., 0.5 to 15 mm), and thereby the frame 7 can be put off from the measuring equipment such as the probe card 80. In such a case, if the frame 7 is moved downward, the film 1 for manufacturing a part bonded to the frame 7 is stretched within an opening 71, and therefore the film 1 for manufacturing a part requires flexibility capable of following this movement. Moreover, as described later, the evaluation is also made at low temperatures, and the tensile elastic modulus E' at a low temperature of the base layer 11 is necessarily higher than the tensile elastic modulus E' at a high temperature, and therefore it is important to maintain the flexibility at a low temperature. As described above, it becomes necessary to be able to maintain the flexibility in a low temperature environment in the film 1 for manufacturing a part required to undergo the evaluation step. However, a material easily attaining heat resistance under high temperature is usually a material having a high tensile elastic modulus at high temperature, and the tensile elastic modulus of such a material further increases at low temperature, and therefore it is difficult for the material to endure the above-mentioned conditions. In this regard, the film 1 for manufacturing a part in which the ratio $R_E$ of the base layer 11 is such that $R_E \geq 0.01$ and the E'(−40) is such that 100 MPa≤E'(−40)≤1000 MPa, can satisfy the above-mentioned requirements.

The E'(−40) is preferably such that 100 MPa≤E'(−40)≤1000 MPa, further preferably such that 150 MPa≤E'(−40)≤900 MPa, more preferably such that 200 MPa≤E'(−40)≤800 MPa, and particularly preferably such that 250 MPa≤E'(−40)≤700 MPa. A value of the E'(−40) is preferably in the above-mentioned range in both of a MD direction and a TD direction of the base layer 11.

E'(160) is such that 1 MPa≤E'(160)≤100 MPa. According to the film 1 for manufacturing a semiconductor part of the present invention, the characteristic that the base layer 11 is such that 1 MPa≤E'(160)≤100 MPa enables to prevent the film for manufacturing a semiconductor part from melting in high-temperature environments and to maintain a shape of the film.

The E'(160) may be such that 0.1 MPa≤E'(160)≤10 MPa, and it is preferably such that 2 MPa≤E'(160)≤80 MPa, more preferably such that 3 MPa≤E'(160)≤60 MPa, and particularly preferably such that 4 MPa≤E'(160)≤40 MPa. A value of the E'(160) is preferably in the above-mentioned range in both of a MD direction and a TD direction of the base layer 11.

The tensile elastic modulus E' of the base layer 11 is measured with a dynamic mechanical analysis (DMA) apparatus. Specifically, a sample size was set to a width of 10 mm, a distance between chucks was set to 20 mm, and measurement was carried out from −50° C. to 200° C. under the conditions of a frequency of 1 Hz and a temperature raising rate of 5° C./min, and data at each temperature was read from the resulting data to obtain the tensile elasticity. That is, a value at −40° C. is taken as a tensile elastic modulus E'(−40), and a value at 160° C. is taken as a tensile elastic modulus E'(160).

Further, a thickness of the base layer 11 is not particularly limited, and it is preferably 50 μm or more and 200 μm or less, more preferably 65 μm or more and 175 μm or less, and particularly preferably 80 μm or more and 150 μm or less.

In addition, it does not matter whether the base layer 11 is stretched or not stretched.

It is only necessary that the base layer 11 can support the adhesive layer 12, and has the above-mentioned ratio $R_E$ and E'(−40), and a material of the base layer 11 is not particularly limited. A material constituting the base layer 11 is preferably a resin.

Further, among resins, a resin having elastomeric properties is preferred from the viewpoint of achieving the above-mentioned ratio $R_E$ and E'(−40). Examples of the resin having elastomeric properties include thermoplastic elastomers, silicone and the like. These resins may be used singly, or may be used in combination of two or more thereof. Among these, a resin having thermoplasticity is preferred, and thermoplastic elastomers are preferred.

When the base layer 11 contains the thermoplastic elastomer, the ratio of the thermoplastic elastomer to the whole resin constituting the base layer 11 can be set to, for example, 30% by mass or more and 100% by mass or less. That is, the resin constituting the base layer 11 may be composed of only a thermoplastic elastomer. A ratio of the thermoplastic elastomer is preferably 50% by mass or more and 100% by mass or less, and more preferably 70% by mass or more and 100% by mass or less.

The thermoplastic elastomer may be composed of a block copolymer having a hard segment and a soft segment or a polymer alloy of a hard polymer and a soft polymer, or may be one having characteristics of both of the block copolymer and the polymer alloy. Values of the tensile elasticities E' of the base layer 11 can be controlled by adjusting these components constituting the base layer 11. That is, the values of the elastic moduli E' can be controlled by adjusting kinds of resins, ratios of resins in the case of containing plural kinds of resins and molecular structures (ratios of the hard segment and the soft segment) of polymers constituting resins.

Examples of the thermoplastic elastomer include polyester-based thermoplastic elastomers (thermoplastic polyester elastomer), polyamide-based thermoplastic elastomers (thermoplastic polyamide elastomer), styrene-based thermoplastic elastomers (thermoplastic styrene elastomer), olefin-based thermoplastic elastomers (thermoplastic polyolefin elastomer), vinyl chloride-based thermoplastic elastomers (thermoplastic vinyl chloride elastomer), polyimide-based thermoplastic elastomers [thermoplastic polyimide elastomer, polyimideester-based thermoplastic elastomers (thermoplastic polyimideester elastomer), polyimideurethane-based thermoplastic elastomers (thermoplastic polyimideurethane elastomer), etc.], polyurethane-based thermoplastic elastomers (thermoplastic polyurethane elastomer), and the like. These resins may be used singly, or may be used in combination of two or more thereof.

Among these thermoplastic elastomers, polyester-based thermoplastic elastomers, polyamide-based thermoplastic elastomers and polyimide-based thermoplastic elastomers are preferred, and polyester-based thermoplastic elastomers and/or polyamide-based thermoplastic elastomers are particularly preferred.

The polyester-based thermoplastic elastomer may have any constitution except for containing a polyester component as a hard segment. As the soft segment, polyester, polyether, polyether-ester or the like can be used. These resins may be used singly, or may be used in combination of two or more thereof. That is, for example, as the polyester component constituting the hard segment, a constituent unit derived from a monomer such as dimethyl terephthalate may be contained. On the other hand, as the component constituting the soft segment, a constituent unit derived from a monomer such as 1,4-butanediol and poly(oxytetramethylene)glycol, may be contained.

More specific examples thereof include a PBT-PE-PBT type polyester-based thermoplastic elastomer and the like. In addition, PBT in the above description "PBT-PE-PBT" refers to polybutylene terephthalate, and PE refers to a polyether.

Specific examples of the polyester-based thermoplastic elastomers includes "PRIMALLOY (trade name)" manufactured by Mitsubishi Chemical Corporation, "Hytrel (trade name)" manufactured by Du pont-Toray Co., Ltd., "PELPRENE (trade name)" manufactured by TOYOBO CO., LTD., "HYPER ALLOY ACTYMER (trade name)" manufactured by RIKEN TECHNOS CORPORATION, and the like. These resins may be used singly, or may be used in combination of two or more thereof.

The polyamide-based thermoplastic elastomer may have any constitution except for containing a polyamide component as a hard segment. As the soft segment, polyester, polyether, polyether-ester or the like can be used. These amide-based thermoplastic elastomers may be used singly, or may be used in combination of two or more thereof. That is, examples of the polyamide component constituting the hard segment include polyamide 6, polyamide 11, polyamide 12 and the like. These polyamide components may be used singly, or may be used in combination of two or more thereof. Various lactams and the like can be used as a monomer for these polyamide components. On the other hand, as the component constituting the soft segment, a monomer such as dicarboxylic acid or a constituent unit derived from polyether polyol, may be contained. As the polyether polyol among these, polyether diol is preferred, and examples thereof include poly(tetramethylene)glycol, poly(oxypropylene)glycol and the like. These polyether polyols may be used singly, or may be used in combination of two or more thereof.

More specific examples thereof include polyether amide type polyamide-based thermoplastic elastomers, polyester amide type polyamide-based thermoplastic elastomers, polyether ester amide type polyamide-based thermoplastic elastomers, and the like.

Specific examples of the polyamide-based thermoplastic elastomers include "Pebax (trade name)" manufactured by ARKEMA K.K., "DAIAMID (trade name)" manufactured by Daicel-Evonik Ltd., "VESTAMID (trade name)" manufactured by Daicel-Evonik Ltd., "UBESTA XPA (trade name)" manufactured by Ube Industries, Ltd., and the like. These polyamide-based thermoplastic elastomers may be used singly, or may be used in combination of two or more thereof.

When the base layer 11 contains a resin other than the thermoplastic elastomer, examples of such a resin include polyester, polyamide, polycarbonate, an acrylic resin and the like. These resins may be used singly, or may be used in combination of two or more thereof. Among these resins, polyester and/or polyamide is preferred, and specific examples thereof include polyesters such as polyethylene terephthalate, polybutylene terephthalate, polyethylene naphthalate and polybutylene naphthalate; and polyamides such as nylon 6 and nylon 12. Further, when the base layer 11 contains (e.g., 1% by mass or more) a resin other than the thermoplastic elastomer, the percentage of the resin is preferably less than 50% by mass, and more preferably less than 30% by mass assuming that a total of the thermoplastic elastomer and the resin other than the thermoplastic elastomer is 100% by mass.

Furthermore, the base layer 11 can contain various additives such as a plasticizer and a softener (mineral oil, etc.), fillers (carbonate, sulfate, titanate, silicate, oxides (titanium oxide, magnesium oxide), silica, talc, mica, clay, fiber filler, etc.), antioxidant, photostabilizer, anti-static agent, lubricant, coloring agent and the like in a resin constituting the base layer 11. These additives may be used singly, or may be used in combination of two or more thereof.

(2) Adhesive Layer

The adhesive layer 12 is a layer formed of an adhesive, and can be disposed on only one surface of the base layer 11 or can be disposed on both surfaces of the base layer 11. The adhesive layer 12 may be disposed in direct contact with the base layer 11, or may be disposed on the base layer 11 with another layer interposed between the adhesive layer 12 and the base layer 11.

The adhesive force of the adhesive layer 12 is not particularly limited; however, it is preferred that the adhesive force to a silicon wafer (measured in an environment of a temperature of 23° C. and a relative humidity of 50%), measured according to JIS Z 0237, at the time when the adhesive layer 12 is peeled off from the surface of the silicon wafer after being bonded to the surface of the silicon wafer and left standing for 60 minutes, be 0.1 to 10 N/25 mm. When the adhesive force is in the above-mentioned range, an adhesive deposit at the time when the sealed electronic device is peeled can be suppressed while ensuring good adhesiveness to the semiconductor part. The adhesive force is more preferably 0.2 N/25 mm or more and 9 N/25 mm or less, and still more preferably 0.3 N/25 mm or more and 8 N/25 mm or less.

A thickness (thickness of one surface side of the base layer 11) of the adhesive layer 12 is not particularly limited, and it is preferably 1 µm or more and 40 µM or less, more preferably 2 µm or more and 35 µm or less, and particularly preferably 3 µm or more and 25 µm or less.

The adhesive may have characteristics described above, and any material may be used. The adhesive usually includes at least an adhesive main agent. Examples of the adhesive main agent include an acrylic adhesive agent, a silicone-based adhesive agent, a rubber-based adhesive agent and the like. These adhesives may be used singly, or may be used in combination of two or more thereof. Among these adhesive agents, the acrylic adhesive agent is preferred.

Examples of the acrylic adhesive agent include a homopolymer of an acrylate compound, a copolymer of an acrylate compound and a comonomer, and the like. These acrylic adhesive agents may be used singly, or may be used in combination of two or more thereof.

Further, examples of the acrylate compound include methyl acrylate, ethyl acrylate, butyl acrylate, 2-ethylhexyl acrylate and the like. These acrylate compounds may be used singly, or may be used in combination of two or more thereof.

Furthermore, examples of the comonomer include vinyl acetate, acrylonitrile, acrylamide, styrene, methyl (meth) acrylate, (meth)acrylic acid, hydroxyethyl methacrylate, dimethylaminoethyl methacrylate, glycidyl methacrylate, maleic anhydride and the like.

Furthermore, the adhesive may contain a cross-linking agent other than the adhesive main agent. Examples of the cross-linking agent include epoxy-based cross-linking agents (pentaerythritol polyglycidyl ether, etc.), isocyanate-based cross-linking agents (diphenylmethane diisocyanate, tolylene diisocyanate, tetramethylene diisocyanate, hexamethylene diisocyanate, polyisocyanate, etc.). These cross-linking agents may be used singly, or may be used in combination of two or more thereof. When the cross-linking agent is contained in the adhesive, the content of the cross-linking agent is preferably set to 10 parts by mass or less with respect to 100 parts by mass of the whole adhesive. The adhesive force of the adhesive layer can be adjusted by the content of the cross-linking agent. Specifically, a method described in JP 2004-115591 A can be employed.

The adhesive agent may be an energy-curable adhesive which is cured by an energy ray, or may be an energy-non-curable adhesive which is not cured by an energy ray, or further may be an energy-foamable adhesive which is foamed by an energy ray.

When the adhesive is the energy-curable adhesive among these adhesives, the adhesive can be cured to reduce the adhesive force thereof by irradiating the adhesive with energy rays. Thus, the adhesive deposit to the electronic device can be prevented with more reliability when the resulting electronic device and the film for manufacturing a semiconductor part are separated.

The energy-curable adhesive may be one which is cured with any energy ray. Examples of the energy ray include an ultraviolet ray, an electron ray, an infrared ray and the like. These energy rays may be used singly, or may be used in combination of two or more thereof. Specific examples thereof include an ultraviolet curable adhesive which is cured with ultraviolet rays.

When the adhesive is an energy-curable adhesive, the adhesive can contain a compound having a carbon-carbon double bond in a molecule (hereinafter, referred to as merely "curing compound") and a photo-polymerization initiator capable of initiating the polymerization of the curing compound in response to the energy rays other than the above-mentioned adhesive main agent. The curing compound is preferably a monomer, an oligomer and/or a polymer which has a carbon-carbon double bond in a molecule and can be cured through radical polymerization. Specific examples of the curing compound include trimethylolpropane tri(meth) acrylate, pentaerythritol tri(meth)acrylate, dipentaerythritol hexa(meth)acrylate, tetraethyleneglycol di(meth)acrylate, 1,6-hexanediol di(meth)acrylate, neopentylglycol di(meth) acrylate and the like. These curing compounds may be used singly, or may be used in combination of two or more thereof. When the curing compound is contained in the adhesive, the content of the curing compound is preferably 0.1 to 20 parts by mass with respect to 100 parts by mass of the adhesive.

In addition, the carbon-carbon double bond in a molecule may be contained not in the curing compound but in the adhesive main agent. That is, for example, the adhesive main agent can be an energy-curable polymer having a carbon-carbon double bond in a side chain. As described above, when the adhesive main agent has a curable structure in a molecule, the curable compound may be mixed, or does not have to be mixed.

On the other hand, as the photo-polymerization initiator, a compound capable of producing a radical by irradiation of energy rays is preferred. Specific examples of such a photo-polymerization initiator include acetophenone-based photo-polymerization initiators (methoxyacetophenone, etc.), α-ketol compounds (4-(2-hydroxyethoxy)phenyl (2-hydroxy-2-propyl) ketone, α-hydroxycyclohexyl phenyl ketone, etc.), ketal-based compounds (benzyl dimethyl ketal, etc.), benzoin-based photo-polymerization initiators (benzoin, benzoin alkyl ethers (benzoin methyl ether, benzoin isopropyl ether, benzoin isobutyl ether,), etc.), benzophenone-based photo-polymerization initiators (benzophenone, benzoylbenzoic acid, etc.), aromatic ketals (benzyl dimethyl ketal, etc.), and the like. These compounds may be used singly, or may be used in combination of two or more thereof. When the photo-polymerization initiator is contained in the adhesive, the content of the photo-polymerization initiator is preferably set to 5 to 15 parts by mass with respect to 100 parts by mass of the adhesive.

(3) Other Layers

The film 1 for manufacturing a semiconductor part of the present invention may include only the base layer 11 and the adhesive layer 12, or may include other layers. Examples of other layers include a projection-depression absorbing layer which can absorb a projection and depression shape of a bonding plane to make a film surface smooth, an interface-strength improving layer which improves strength of an interface with the adhesive, and a migration preventive layer which suppress the migration of a low molecular weight component from a base material to an adhesive surface. These layers may be used singly, or may be used in combination of two or more thereof.

(4) Manufacturing of Film for Manufacturing Semiconductor Part

The film for manufacturing a semiconductor part of the present invention may be manufactured by any method, and the method is not particularly limited. Specifically, the film can be manufactured by a method such as a co-extrusion method, an extrusion lamination method, an adhesive lamination method or an application method. Among these methods, the co-extrusion method is a method in which a molten resin serving as the adhesive layer 12 is laminated on a molten resin serving as the base layer 11 by co-extrusion to manufacture a film for manufacturing a semiconductor part.

The extrusion lamination method is a method of laminating a molten resin serving as the adhesive layer 12 on the base layer 11 by extrusion to manufacture a film for manufacturing a semiconductor part.

Furthermore, the application method is a method of laminating a molten resin serving as the adhesive layer 12 on the base layer 11 by application or coating to manufacture a film for manufacturing a semiconductor part. When the energy-curable adhesive is used as an adhesive constituting the adhesive layer 12, the application method is preferably used.

Further, the adhesive lamination method is a method of laminating the adhesive layer 12 on the base layer 11 through thermocompression bonding, an adhesive or hot-melt to manufacture a film for manufacturing a semiconductor part.

These methods may be used singly, or may be used in combination of two or more thereof.

[2] Method for Manufacturing Semiconductor Part

The film 1 for manufacturing a semiconductor part of the present invention is used in a method for manufacturing a semiconductor part. The method for manufacturing a semiconductor part includes a segmenting step R4 (refer to FIG. 5) and a pickup step R7 (refer to FIG. 8), and includes an evaluation step R3 (refer to FIG. 4) and/or an evaluation step R5 (refer to FIG. 6) prior to the pickup step R7.

Figure 2:
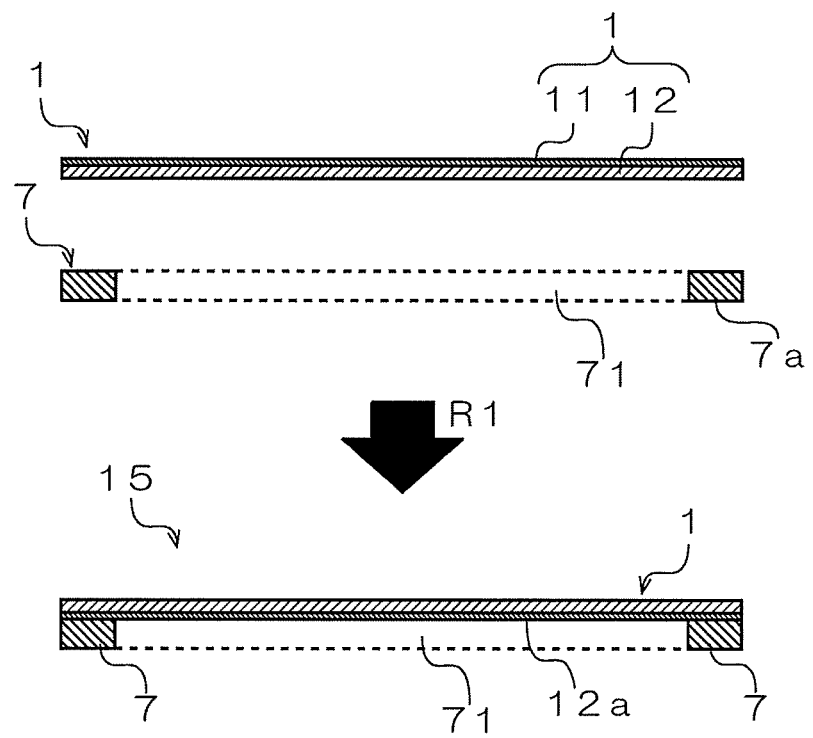
FIG. 2 is an illustrative drawing explaining a protecting member forming step according to the present method for manufacturing a semiconductor part.
Figure 3:
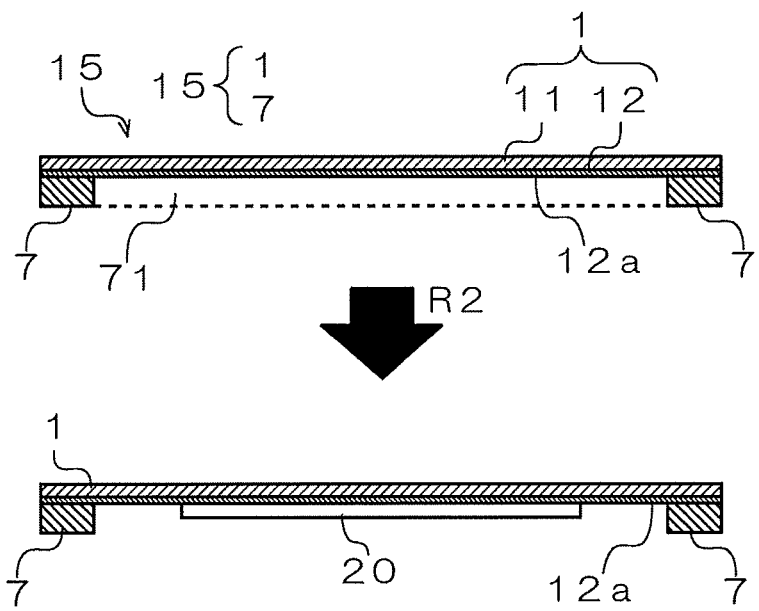
FIG. 3 is an illustrative drawing explaining a bonding step according to the present method for manufacturing a semiconductor part.

A bonding step R2 (refer to FIG. 3) is usually disposed as a precedent step of the segmenting step R4 (refer to FIG. 5) among these steps. The bonding step R2 (refer to FIG. 3) is a step of bonding the adhesive layer 12 of the film 1 for manufacturing a semiconductor part to a back surface of the semiconductor wafer having circuits formed thereon. Usually, the film 1 for manufacturing a semiconductor part is used as a protecting member 15 by bonding the adhesive layer 12 of the film 1 for manufacturing a semiconductor part to one surface 7*a* of a frame 7 having an opening 71, the adhesive layer 12 being bonded so as to cover the opening 71 of the frame 7 (protecting member forming step R1, refer to FIG. 2). Further, the bonding step R2 (refer to FIG. 3) is a step of bonding a semiconductor wafer 20 to the surface 12*a* of the adhesive layer 12 that is exposed via the opening 71 of the frame 7 of the protecting member 15, and these protecting member forming step R1 (refer to FIG. 2) and bonding step R2 (refer to FIG. 3) are simultaneously performed. In addition, naturally, the protecting member forming step R1 (refer to FIG. 2) and the bonding step R2 (refer to FIG. 3) can also be performed separately, as required.

The semiconductor wafer 20 may be a semiconductor wafer which can be suitably bonded to the present film 1 for manufacturing a semiconductor part, and a kind of the semiconductor wafer 20 is not particularly limited, and examples thereof include a silicon substrate, a sapphire substrate, a germanium substrate, a germanium-arsenic substrate, a gallium-phosphorus substrate, and a gallium-arsenic-aluminum substrate. Examples of the semiconductor wafer using the sapphire substrate among these semiconductor substrates include a semiconductor wafer in which a semiconductor layer (GaN, etc.) is laminated on the sapphire substrate. Circuits are usually formed on the surfaces of these semiconductor wafers. Examples of the circuits include a wiring, a capacitor, a diode, a transistor and the like. These semiconductor wafers may be used singly, or may be used in combination of two or more thereof.

The segmenting step R4 (refer to FIG. 5) is a step of separating (dicing) a semiconductor wafer, a back surface of which a film 1 for manufacturing a semiconductor part is bonded to, into segments to obtain semiconductor parts 21. The segmenting step R4 can be appropriately performed using a publicly known method. In addition, the segmentation may be performed so that at least one semiconductor circuit region is contained in one semiconductor part 21, or may be performed so that two or more semiconductor circuit regions are contained in one semiconductor part 21.

The pickup step R7 (refer to FIG. 8) is a step of separating the segmented semiconductor part from the adhesive layer 12 of the film 1 for manufacturing a semiconductor part. The pickup step R7 can be appropriately performed using a publicly known method, and for example, as exemplified in FIG. 8, a semiconductor part 21', a pickup object, is pushed up with a pushing-up member 92 from a side of the base layer 11 of the film 1 for manufacturing a semiconductor part, and the pushed-up semiconductor part 21' can be picked-up through a method such as suction or the like by a picking-up instrument 93.

The evaluation step is a step of evaluating the semiconductor wafer or the semiconductor part in a temperature region of 0° C. or lower, or 100° C. or higher prior to the pickup step. That is, the evaluation step includes the evaluation step R3 (refer to FIG. 4) of evaluating the semiconductor wafer in a temperature region of 0° C. or lower, or 100° C. or higher prior to the segmenting step and prior to the pickup step, and the evaluation step R5 (refer to FIG. 6) of evaluating the semiconductor part in a temperature region of 0° C. or lower, or 100° C. or higher subsequent to the segmenting step and prior to the pickup step. Only any one of the evaluation step R3 and the evaluation step R5 may be performed, or both of them may be performed, as required.

An evaluation of the semiconductor wafer 20 or the semiconductor part 21 specifically includes the following (1) semiconductor wafer evaluation and the following (2) semiconductor part evaluation. Of these, (1) semiconductor wafer evaluation is an evaluation made in a state of a semiconductor wafer, by use of a prober, on whether or not electrical properties of a plurality of circuits (corresponding to a circuit of each semiconductor part) formed on a semiconductor wafer, are desired properties in a temperature region of 0° C. or lower, or 100° C. or higher. On the other hand, (2) semiconductor part evaluation is an evaluation made in a state in which a semiconductor wafer is separated into segments and a plurality of semiconductor parts are arranged in the form of an array, by use of a prober, on whether or not electrical properties of these semiconductor parts are desired properties in a temperature region of 0° C. or lower, or 100° C. or higher.

These evaluations include one intended to verify an operation in the above-mentioned temperature region and one intended for an accelerated endurance test in the above-mentioned temperature region (e.g., burn-in test).

Figure 4:
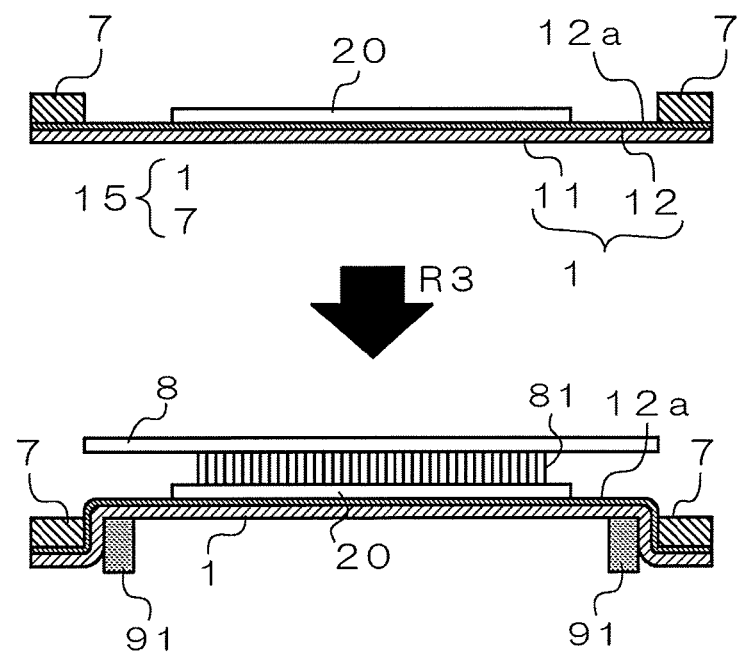
FIG. 4 is an illustrative drawing explaining an evaluation step according to the present method for manufacturing a semiconductor part.
Figure 5:
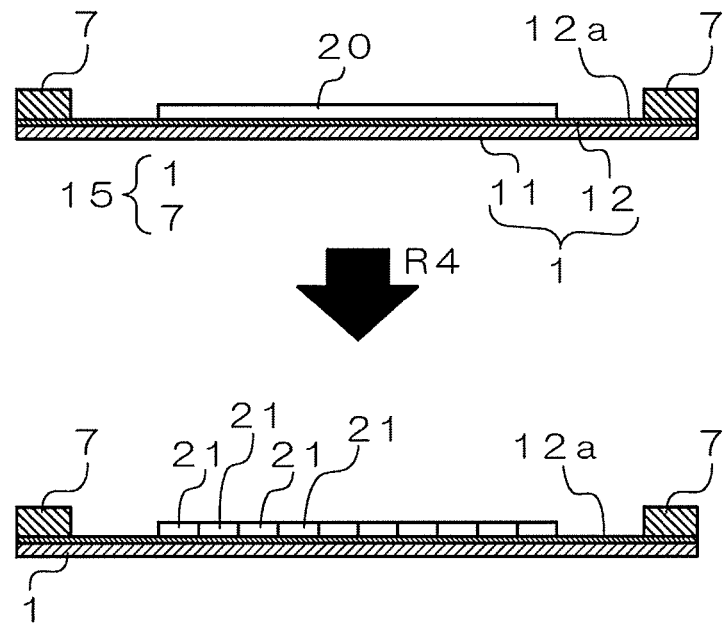
FIG. 5 is an illustrative drawing explaining a segmenting step according to the present method for manufacturing a semiconductor part.

Of the above-mentioned evaluation steps, when the evaluation step R3 (refer to FIG. 4) is performed, that is, when the evaluation is made prior to the segmenting step and prior to the pickup step (evaluation is performed on a semiconductor wafer 20), for example, a probe card 8 having a plurality of probes 81 font led thereon is brought into contact with predetermined corresponding locations of the semiconductor wafer 20 to make electrical connection, and an evaluation is made by determining whether a signal communicated between the probe 81 and a circuit formed on the semiconductor wafer 20 is right or wrong (probe test) (refer to FIG. 4). In doing so, when as described above, the semiconductor wafer 20 is subjected to evaluation in a state in which the film 1 for manufacturing a semiconductor part is fixed to the frame 7 of the protecting member 15 and a back surface of the semiconductor wafer 20 is bonded to the adhesive layer 12 of the film 1, in order to avoid contact between parts on measuring equipment side such as the probe card 80 and the frame 7, a vacuum chuck table (not shown) and an instrument such as a stopper 91 are placed inside the frame 7, and the frame 7 is pressed downward (e.g., 0.5 to 15 mm), and thereby the frame 7 can be put off from the measuring equipment such as the probe card 80.

Figure 6:
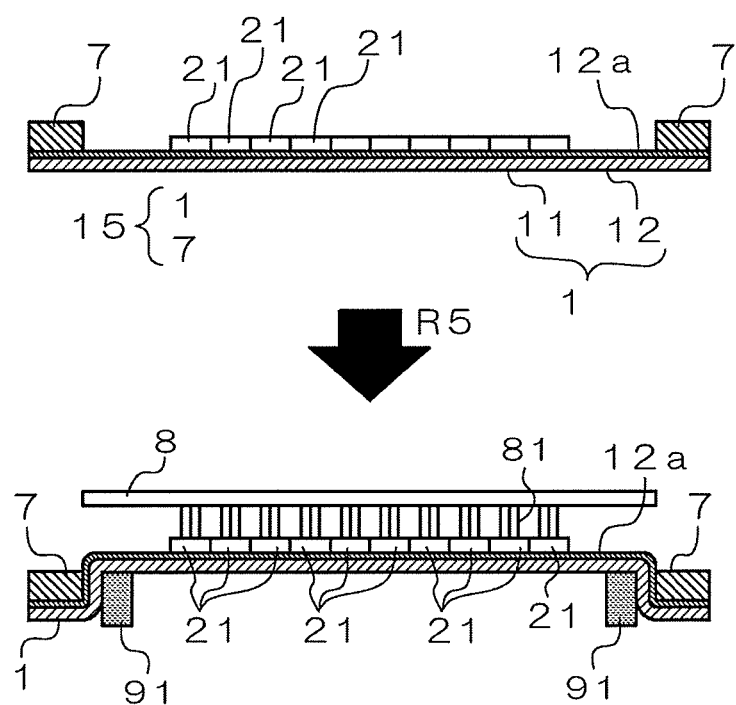
FIG. 6 is an illustrative drawing explaining an evaluation step according to the present method for manufacturing a semiconductor part.

On the other hand, of the above-mentioned evaluation steps, when the evaluation step R5 (refer to FIG. 6) is performed, that is, when the evaluation is performed subsequent to the segmenting step and prior to the pickup step (evaluation is performed on a semiconductor part 21), for example, a probe card 8 having a plurality of probes 81 formed thereon is brought into contact with predetermined corresponding locations of the semiconductor part 21 to make electrical connection, and an evaluation is performed by determining whether a signal communicated between the probe 81 and a circuit formed on the semiconductor part 21 is right and wrong (probe test) (refer to FIG. 6). Similarly in this case, when the semiconductor part 21 is subjected to evaluation in a state in which the film 1 for manufacturing a semiconductor part is fixed to the frame 7 of the protecting member 15 and a back surface of the semiconductor part 21 is bonded to the adhesive layer 12 of the film 1, in order to avoid contact between parts on measuring equipment side such as the probe card 80 and the frame 7, a vacuum chuck table (not shown) and an instrument such as a stopper 91 are placed inside the frame 7, and the frame 7 is pressed downward (e.g., 0.5 to 15 mm), and thereby the frame 7 can be put off from the measuring equipment such as the probe card 80.

These evaluations are not particularly limited as long as they are made in a temperature region of 0° C. or lower and/or 100° C. or higher, and may include a non-contact optical evaluation other than an electrical evaluation (probe test) which is made by contact of a probe as described above.

Further, an evaluation temperature region may be 0° C. or lower on a lower temperature side, and may be 100° C. or higher on a higher temperature side. Particularly, the present film 1 for manufacturing a semiconductor part can maintain required flexibility in an evaluation step even when a step of evaluating the film 1 for manufacturing a semiconductor part is performed at a temperature of −80° C. or higher and 0° C. or lower (further −60° C. or higher and −10° C. or lower, particularly −40° C. or higher and −10° C. or lower) on a lower temperature side. Furthermore, the film 1 for manufacturing a semiconductor part does not interfere with the pickup step R7 (refer to FIG. 8). That is, the film 1 for manufacturing a semiconductor part maintains flexibility in pushing up the film 1 with the pushing-up member 92 in the pickup step R7 (refer to FIG. 8), and the film 1 for manufacturing a semiconductor part can be pushed up without being broken. Particularly, when the method includes a part-isolating step R6 (refer to FIG. 7) prior to the pickup step R7 (refer to FIG. 8), the film 1 for manufacturing a semiconductor part is further susceptible to break, but the break can be prevented to smoothly perform pickup by using the aforementioned film 1 for manufacturing a semiconductor part.

Furthermore, the film 1 for manufacturing a semiconductor part can maintain required flexibility in an evaluation step even when a step of evaluating the film 1 for manufacturing a semiconductor part is performed at a temperature of 100° C. or higher and 170° C. or lower (further 110° C. or higher and 170° C. or lower, particularly 120° C. or higher and 160° C. or lower) on a higher temperature side. Furthermore, the film 1 for manufacturing a semiconductor part does not interfere with the pickup step R7 (refer to FIG. 8). That is, the film 1 for manufacturing a semiconductor part maintains flexibility in pushing up the film 1 with the pushing-up member 92 in the pickup step R7 (refer to FIG. 8), and the film 1 for manufacturing a semiconductor part can be pushed up without being broken. Particularly, when the method includes the part-isolating step R6 (refer to FIG. 7) prior to the pickup step R7 (refer to FIG. 8), the film 1 for manufacturing a semiconductor part is further susceptible to break, but the break can be prevented to smoothly perform pickup by using the aforementioned film 1 for manufacturing a semiconductor part.

Furthermore, these evaluations may be made only on any one of a low-temperature side and a high-temperature side; however, the film 1 for manufacturing a semiconductor part can be one which does not interfere with the pickup step R7 (refer to FIG. 8) even if these evaluations are made on both sides.

Figure 8:
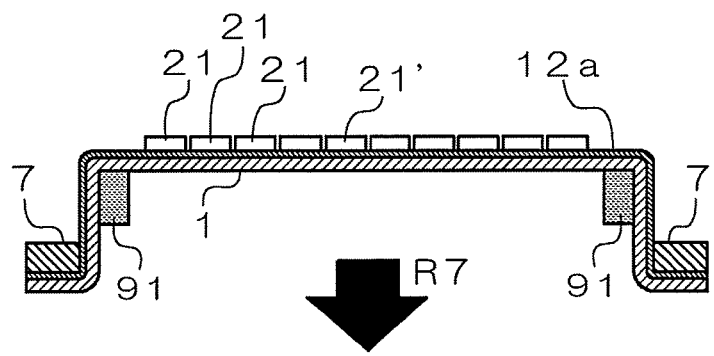
FIG. 8 is an illustrative drawing explaining a pickup step according to the present method for manufacturing a semiconductor part.
Figure 8:
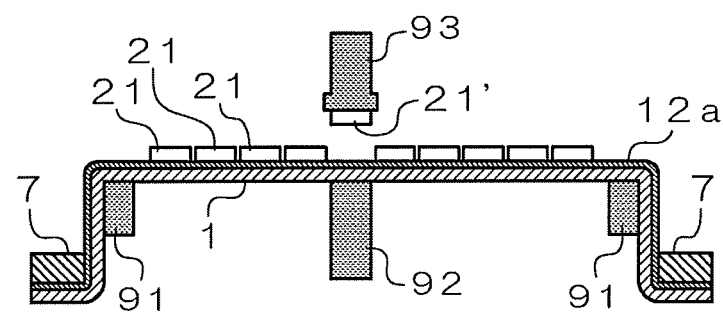

In the above-mentioned manufacturing method, other steps may be included other than the bonding step R2 (refer to FIG. 3), the evaluation step R3 (refer to FIG. 4), the segmenting step R4 (refer to FIG. 5), the evaluation step R5 (refer to FIG. 6) and the pickup step R7 (refer to FIG. 8).

Figure 7:
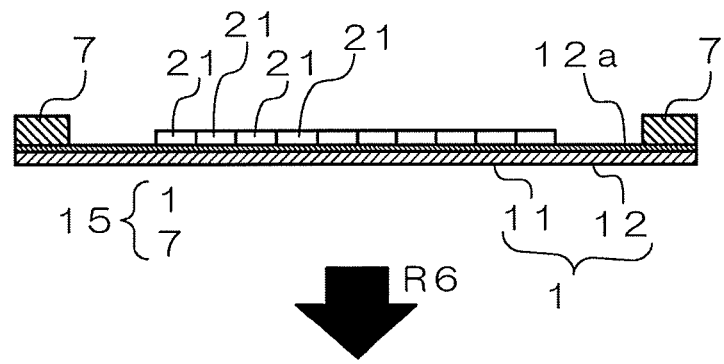
FIG. 7 is an illustrative drawing explaining a part-isolating step according to the present method for manufacturing a semiconductor part.
Figure 7:
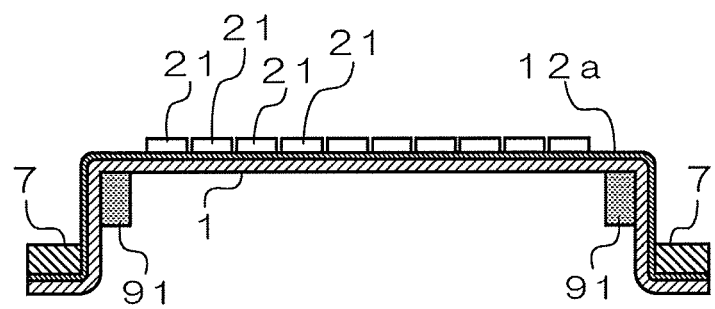

Examples of other steps include the protecting member forming step R1 (refer to FIG. 2) and the part-isolating step R6 (refer to FIG. 7).

Of these steps, the protecting member forming step R1 (refer to FIG. 2) is a step of bonding an adhesive layer 12 of a film 1 for manufacturing a semiconductor part to one surface 7a of a frame 7 having an opening 71, the adhesive layer 12 being bonded so as to cover the opening 71 of the frame 7.

As the frame 7, for example, a ring frame can be used. An outline of the frame 7 is not particularly limited, and it can appropriately have a shape responsive to necessity. For example, a circle, a quadrangle or the like can be employed. Similarly, an outline of the opening 71 is also not particularly limited, and can appropriately have a shape responsive to necessity, and for example, a circle, a quadrangle or the like can be employed. Also, a material constituting the frame 7 is not limited, and a resin and/or metal or the like can be used.

Further, heating may be performed as required when the adhesive layer 12 of the film 1 for manufacturing a semiconductor part is bonded to one surface 7a of the frame 7 so as to cover the opening 71 of the frame 7.

The part-isolating step R6 (refer to FIG. 7) is a step of isolating the semiconductor parts 21 formed by segmentation on the film 1 for manufacturing a semiconductor part by stretching the film 1 for manufacturing a semiconductor part. Stretching of the film 1 for manufacturing a semiconductor part can be performed while abutting a stopper 91 against the inside of the frame 7.

[3] Film for Manufacturing Electronic Device

A film 1 for manufacturing an electronic device of the present invention is a film used in a method for manufacturing an electronic device. The film 1 for manufacturing an electronic device includes a base layer 11 and an adhesive layer 12 as is the case with the film 1 for manufacturing a semiconductor part (refer to FIG. 1). The adhesive layer 12 may be disposed on at least one surface side of the base layer 11 or may be disposed on both of one surface side and the other surface side of the base layer 11 as required, and the base layer 11 and the adhesive layer 12 may be in direct contact with each other or may be in contact with each other with another layer interposed therebetween as is the case with the film 1 for manufacturing a semiconductor part.

(1) Base Layer

To the base layer 11 in the film 1 for manufacturing an electronic device, the aforementioned description of the base layer 11 in the film 1 for manufacturing a semiconductor part can be applied as-is. Herein, in the description about the base layer 11 of the film 1 for manufacturing a semiconductor part, the term "film for manufacturing a semiconductor part" is replaced with "base layer in the film 1 for manufacturing an electronic device", the term "semiconductor wafer" is replaced with "array-shaped electronic device", and the term "semiconductor part" is replaced with "electronic device".

(2) Adhesive Layer

To the adhesive layer 12 in the film 1 for manufacturing an electronic device, the aforementioned description of the adhesive layer 12 in the film 1 for manufacturing a semiconductor part can be applied as-is. Herein, in the description about the adhesive layer 12 of the film 1 for manufacturing a semiconductor part, the term "film for manufacturing a semiconductor part" is replaced with "base layer in the film 1 for manufacturing an electronic device", the term "semiconductor wafer" is replaced with "array-shaped electronic device", and the term "semiconductor part" is replaced with "electronic device".

(3) Other Layers

To the other layers in the film 1 for manufacturing an electronic device, the aforementioned description of the other layers in the film 1 for manufacturing a semiconductor part can be applied as-is. Herein, in the description about the other layers of the film 1 for manufacturing a semiconductor part, the term "film for manufacturing a semiconductor part" is replaced with "base layer in the film 1 for manufacturing an electronic device", the term "semiconductor wafer" is replaced with "array-shaped electronic device", and the term "semiconductor part" is replaced with "electronic device".

(4) Manufacturing of Film for Manufacturing Electronic Device

To manufacturing of the film for manufacturing an electronic device in the film 1 for manufacturing an electronic device, the aforementioned description of manufacturing of the film for manufacturing a semiconductor part in the film 1 for manufacturing a semiconductor part can be applied as-is. Herein, in the description about manufacturing of the film 1 for manufacturing a semiconductor part, the term "film for manufacturing a semiconductor part" is replaced with "base layer in the film 1 for manufacturing an electronic device", the term "semiconductor wafer" is replaced with "array-shaped electronic device", and the term "semiconductor part" is replaced with "electronic device".

[4] Method for Manufacturing Electronic Device

The film 1 for manufacturing an electronic device of the present invention is used in a method for manufacturing an electronic device. The method for manufacturing an electronic device includes a segmenting step R4 (refer to FIG. 10) and a pickup step R7 (refer to FIG. 13), and includes an evaluation step R3 (refer to FIG. 9) and/or an evaluation step R5 (refer to FIG. 11) prior to the pickup step R7.

The segmenting step R4 (refer to FIG. 10) is a step of separating (dicing) an array-shaped electronic device 50, a back surface of which a film 1 for manufacturing an electronic device is bonded to, into segments to obtain electronic devices 51.

The segmenting step R4 can be appropriately performed using a publicly known method. In addition, the segmentation may be performed so that at least one semiconductor part is contained in one electronic device 51, or may be performed so that two or more semiconductor parts are contained in one electronic device 51.

Further, in the segmenting step R4 (refer to FIG. 10), as is the case with the film 1 for manufacturing a semiconductor part, the frame 7 can be used as a protecting member 15 also in the present film 1 for manufacturing an electronic device.

The array-shaped electronic device 50 is one in which the semiconductor parts are sealed in the form of an array. Specifically, the array-shaped electronic device 50 includes the following electronic devices (1) to (3).

The array-shaped electronic device (1) is an array-shaped electronic device obtained by arraying, on a lead frame, semiconductor parts (chip, die) obtained by separating the semiconductor wafer having circuits formed thereon into segments, performing wire bonding of the semiconductor parts, and sealing the semiconductor parts with a sealant.

The array-shaped electronic device (2) is an array-shaped electronic device obtained by arraying, in a state of being apart from each other, semiconductor parts (chip, die) obtained by separating the semiconductor wafer having circuits formed thereon into segments, sealing the semiconductor parts with a sealant, and then forming external circuits attaining external conduction, such as a rewiring layer and a bump electrode, collectively. That is, the array-shaped electronic device (2) is an array-shaped electronic device obtained in a fan-out system (eWLB system).

The array-shaped electronic device (3) is an array-shaped electronic device obtained by using a semiconductor wafer as a semiconductor part as in a state of a wafer, and forming external circuits attaining external conduction, such as a rewiring layer and a bump electrode, and a sealing layer sealed with a sealant, collectively. The semiconductor wafer in the array-shaped electronic device (3) is in a state of pre-segmentation and includes a configuration in which semiconductor parts (chip, die) are formed in the form of an array and a pattern in which a semiconductor wafer is used as a substrate (pattern in which a chip having a circuit is joined onto a non-circuit silicon substrate and used). That is, the array-shaped electronic device (3) is an array-shaped electronic device obtained in a wafer level chip size package (WLCSP) system.

In addition, in the array-shaped electronic device (2), the film for manufacturing an electronic device of the present invention can be used in forming the array-shaped electronic device (2). Specifically, an array-shaped electronic device can be obtained by arraying semiconductor parts in a state of being apart from each other on the film 1 for manufacturing an electronic device, sealing the semiconductor parts with a sealant, and then forming external circuits attaining external conduction, such as a rewiring layer and a bump electrode, collectively.

The pickup step R7 (refer to FIG. 13) is a step of separating the segmented electronic device 51 from the adhesive layer 12 of the film 1 for manufacturing an electronic device. The pickup step R7 can be appropriately performed using a publicly known method, and for example, as exemplified in FIG. 13, an electronic device 51', a pickup object, is pushed up with a pushing-up member 92 from a side of the base layer 11 of the film 1 for manufacturing an electronic device, and the pushed-up electronic device 51' can be picked up through a method such as suction or the like by a picking-up instrument 93.

The evaluation step is a step of evaluating the array-shaped electronic device or the electronic device in a temperature region of 0° C. or lower, or 100° C. or higher prior to the pickup step. That is, the evaluation step includes the evaluation step R3 (refer to FIG. 9) of evaluating the array-shaped electronic device in a temperature region of 0° C. or lower, or 100° C. or higher prior to the segmenting step and prior to the pickup step, and the evaluation step R5 (refer to FIG. 11) of evaluating the electronic device in a temperature region of 0° C. or lower, or 100° C. or higher subsequent to the segmenting step and prior to the pickup step. Only any one of the evaluation step R3 and the evaluation step R5 may be performed, or both of them may be performed, as required.

An evaluation of the array-shaped electronic device 50 or the electronic device 51 specifically includes the following (1) array-shaped electronic device evaluation and the following (2) electronic device evaluation. Of these, (1) array-shaped electronic device evaluation is an evaluation of the array-shaped electronic device made as in the form of an array, by use of a prober, on whether or not electrical properties of internal circuits contained in the array-shaped electronic device and external circuits (circuits for leading out the internal circuit) formed corresponding to these internal circuits are desired properties in a temperature region of 0° C. or lower, or 100° C. or higher. On the other hand, (2) electronic device evaluation is an evaluation made in a state in which an array-shaped electronic device is separated into segments and a plurality of electronic devices are arranged in the form of an array, by use of a prober, on whether or not electrical properties of these electronic devices are desired properties in a temperature region of 0° C. or lower, or 100° C. or higher.

These evaluations include one intended to verify an operation in the above-mentioned temperature region and one intended for an accelerated endurance test in the above-mentioned temperature region (e.g., burn-in test).

Figure 9:
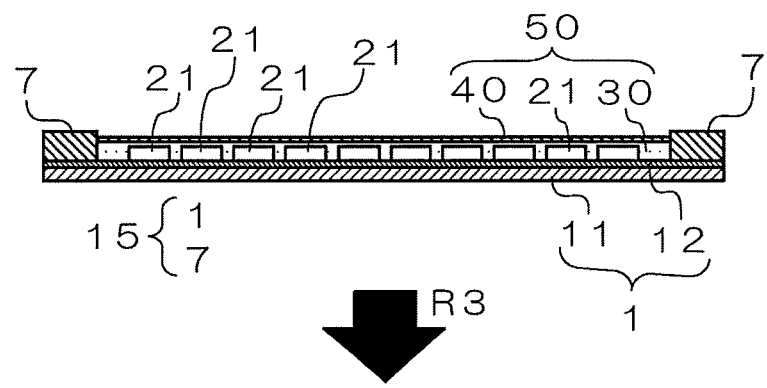
FIG. 9 is an illustrative drawing explaining an evaluation step according to the present method for manufacturing an electronic device.
Figure 9:
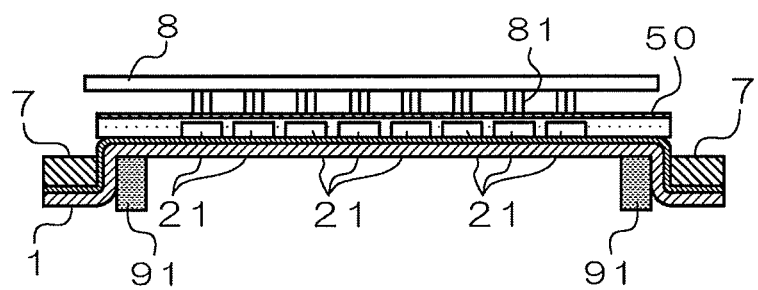
Figure 10:
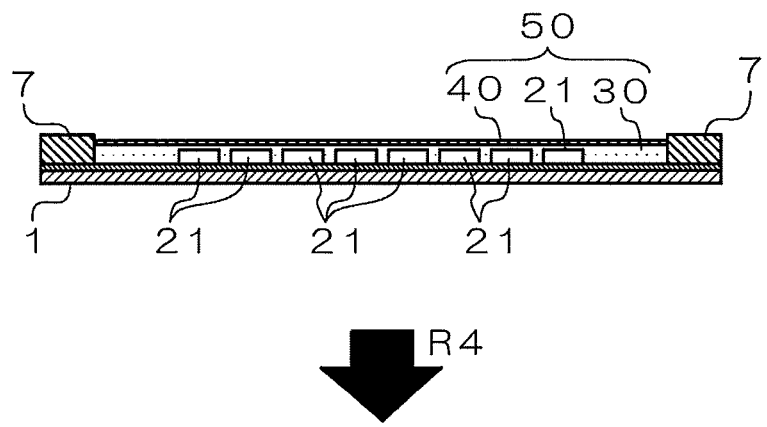
FIG. 10 is an illustrative drawing explaining a segmenting step according to the present method for manufacturing an electronic device.
Figure 10:
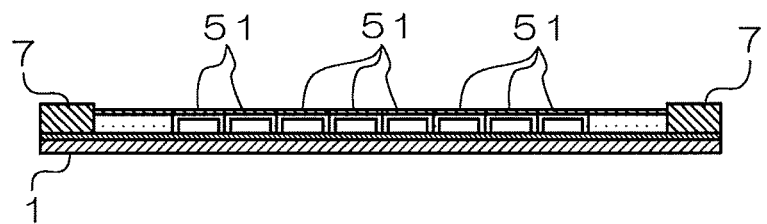

Of the above-mentioned evaluation steps, when the evaluation step R3 (refer to FIG. 9) is performed, that is, when the evaluation is performed prior to the segmenting step and prior to the pickup step (evaluation is performed on an array-shaped electronic device 50), for example, a probe card 8 having a plurality of probes 81 formed thereon is brought into contact with external circuits (bump electrodes or the like) formed on the array-shaped electronic device 50 to make electrical connection, and an evaluation is made by determining whether a signal communicated between the probe 81 and an external circuit formed on the array-shaped electronic device 50 is right or wrong (probe test) (refer to FIG. 9). In doing so, when as described above, the array-shaped electronic device 50 is subjected to evaluation in a state in which the film 1 for manufacturing an electronic device is fixed to the frame 7 of the protecting member 15 and a back surface of the array-shaped electronic device 50 is bonded to the adhesive layer 12 of the film 1, in order to avoid contact between parts on measuring equipment side such as the probe card 80 and the frame 7, a vacuum chuck table (not shown) and an instrument such as a stopper 91 are placed inside the frame 7, and the frame 7 is pressed downward (e.g., 0.5 to 15 mm), and thereby the frame 7 can be put off from the measuring equipment such as the probe card 80.

Figure 11:
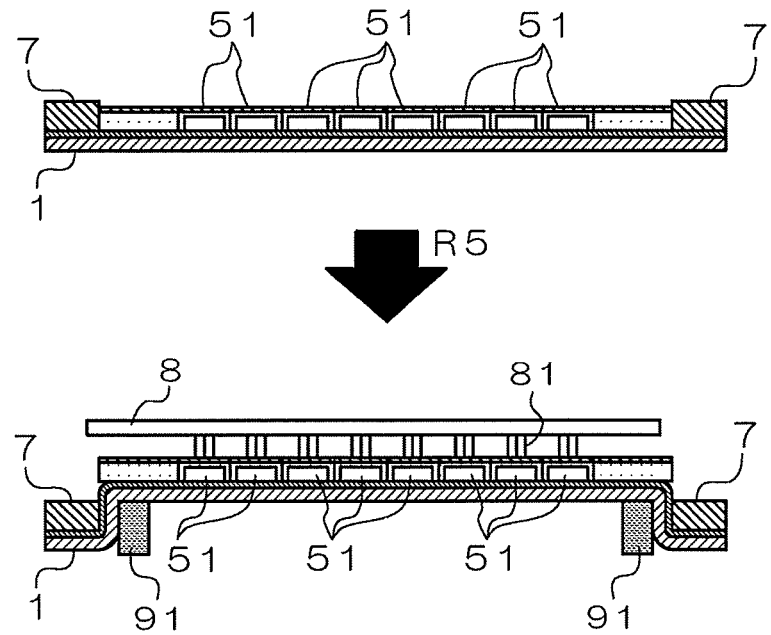
FIG. 11 is an illustrative drawing explaining an evaluation step according to the present method for manufacturing an electronic device.

On the other hand, of the above-mentioned evaluation steps, when the evaluation step R5 (refer to FIG. 11) is performed, that is, when the evaluation is performed subsequent to the segmenting step and prior to the pickup step (evaluation is made on an electronic device 51), for example, a probe card 8 having a plurality of probes 81 formed thereon is brought into contact with predetermined corresponding locations of the electronic device 51 (e.g., external circuit such as a bump electrode) to make electrical connection, and an evaluation is made by determining whether a signal communicated between the probe 81 and an external circuit formed on the electronic device 51 is right or wrong (probe test) (refer to FIG. 11). Similarly in this case, when the electronic device 51 is subjected to evaluation in a state in which the film 1 for manufacturing an electronic device is fixed to the frame 7 of the protecting member 15 and a back surface of the electronic device 51 is bonded to the adhesive layer 12 of the film 1, in order to avoid contact between parts on measuring equipment side such as the probe card 80 and the frame 7, a vacuum chuck table (not shown) and an instrument such as a stopper 91 are placed inside the frame 7, and the frame 7 is pressed downward (e.g., 0.5 to 15 mm), and thereby the frame 7 can be put off from the measuring equipment such as the probe card 80.

These evaluations are not particularly limited as long as they are made in a temperature region of 0° C. or lower and/or 100° C. or higher, and may include a non-contact optical evaluation other than an electrical evaluation (probe test) which is made by contact of a probe as described above.

Further, an evaluation temperature region may be 0° C. or lower on a lower temperature side, and may be 100° C. or higher on a higher temperature side. Particularly, the present film 1 for manufacturing an electronic device can maintain required flexibility in an evaluation step even when a step of evaluating the film 1 for manufacturing an electronic device is performed at a temperature of −80° C. or higher and 0° C. or lower (further −60° C. or higher and −10° C. or lower, particularly −40° C. or higher and −10° C. or lower) on a lower temperature side. Furthermore, the present film 1 for manufacturing an electronic device does not interfere with the pickup step R7 (refer to FIG. 13). That is, the film 1 for manufacturing an electronic device maintains flexibility in pushing up the film 1 with the pushing-up member 92 in the pickup step R7 (refer to FIG. 13), and the film 1 for manufacturing an electron device can be pushed up without being broken. Particularly, when the method includes a part-isolating step R6 (refer to FIG. 12) prior to the pickup step R7 (refer to FIG. 13), the film 1 for manufacturing an electronic device is further susceptible to break, but the break can be prevented to smoothly perform pickup by using the aforementioned film 1 for manufacturing an electronic device.

Furthermore, the film 1 for manufacturing an electronic device can maintain required flexibility in an evaluation step even when a step of evaluating the film 1 for manufacturing an electronic device is performed at a temperature of 100° C. or higher and 170° C. or lower (further 110° C. or higher and 170° C. or lower, particularly 120° C. or higher and 160° C. or lower) on a higher temperature side. Furthermore, the present film 1 for manufacturing an electronic device does not interfere with the pickup step R7 (refer to FIG. 13). That is, the film 1 for manufacturing an electronic device maintains flexibility in pushing up the film 1 with the pushing-up member 92 in the pickup step R7 (refer to FIG. 13), and the film 1 for manufacturing an electron device can be pushed up without being broken. Particularly, when the method includes a part-isolating step R6 (refer to FIG. 12) prior to the pickup step R7 (refer to FIG. 13), the film 1 for manufacturing an electronic device is further susceptible to break, but the break can be prevented to smoothly perform pickup by using the aforementioned film 1 for manufacturing an electronic device.

Furthermore, these evaluations may be made only on any one of a low-temperature side and a high-temperature side; however, the present film 1 for manufacturing an electronic device can be one which does not interfere with the pickup step R7 (refer to FIG. 13) even if these evaluations are made on both sides.

Figure 13:
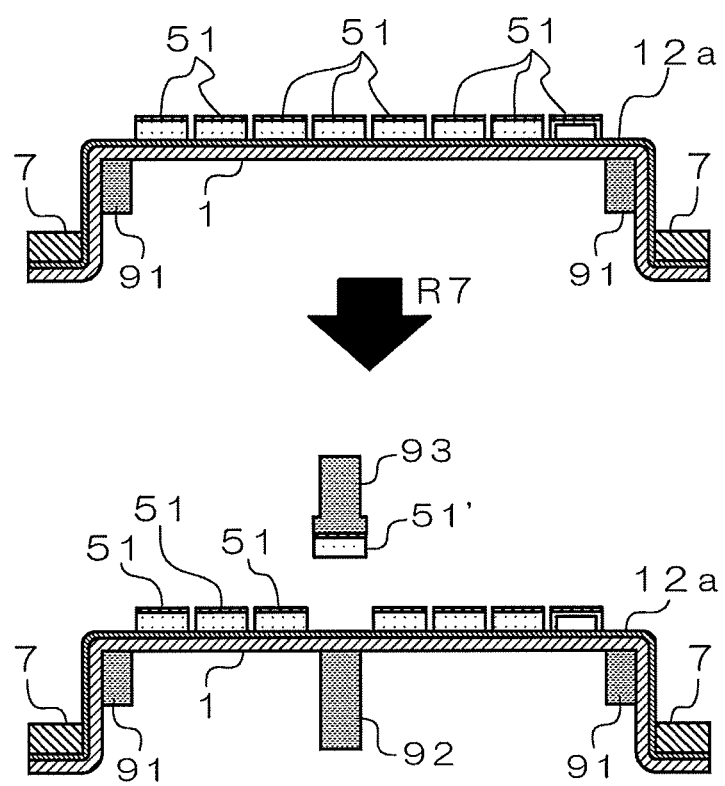
FIG. 13 is an illustrative drawing explaining a pickup step according to the present method for manufacturing an electronic device.

In the above-mentioned manufacturing method, other steps may be included other than the evaluation step R3 (refer to FIG. 9), the segmenting step R4 (refer to FIG. 10), the evaluation step R5 (refer to FIG. 11) and the pickup step R7 (refer to FIG. 13).

Figure 12:
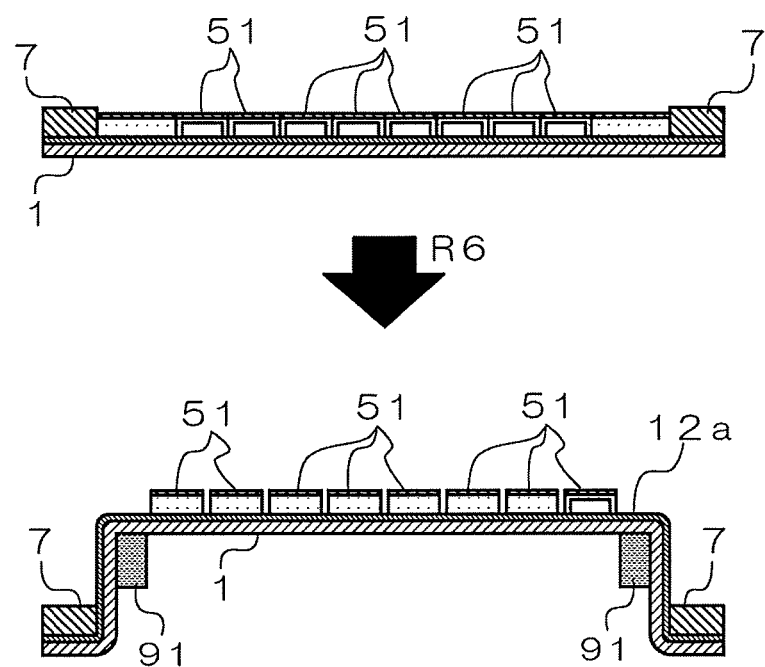
FIG. 12 is an illustrative drawing explaining a part-isolating step according to the present method for manufacturing an electronic device.

Examples of other steps include the part-isolating step R6 (refer to FIG. 12). The part-isolating step R6 (refer to FIG. 12) is a step of isolating the electronic devices 51 formed by segmentation on the film 1 for manufacturing an electronic device by stretching the film 1 for manufacturing an electronic device. Stretching of the film 1 for manufacturing an electronic device can be performed while abutting a stopper 91 against the inside of the frame 7.

[5] Evaluation Method

By using the film 1 for manufacturing a semiconductor part of the present invention, the evaluation of a semiconductor wafer can be made without changing the film 1 for manufacturing a semiconductor part for rebonding during manufacturing a semiconductor part. That is, an evaluation of the semiconductor wafer 20 can be made in a temperature region of 0° C. or lower, or 100° C. or higher in a state in which the film 1 for manufacturing a semiconductor part includes a base layer 11 and an adhesive layer 12 disposed on one surface side of the base layer 11, in the base layer 11, the ratio $R_E$ (=E'(160)/E'(−40)) of the elastic modulus E'(160) at 160° C. to the elastic modulus E'(−40) at −40° C. is such that $R_E \geq 0.01$ and E'(−40) is 10 MPa or more and less than 1000 MPa, and the adhesive layer 12 of the film 1 for manufacturing a semiconductor part is bonded to a back surface of the semiconductor wafer 20 having circuits formed thereon (refer to FIG. 4).

Further, by using the film 1 for manufacturing a semiconductor part of the present invention, the evaluation of a semiconductor part can be performed without changing the film 1 for manufacturing a semiconductor part for rebonding during manufacturing a semiconductor part. That is, an evaluation of the semiconductor part 21 can be made in a temperature region of 0° C. or lower, or 100° C. or higher in a state in which the film 1 for manufacturing a semiconductor part includes a base layer 11 and an adhesive layer 12 disposed on one surface side of the base layer 11, in the base layer 11, the ratio $R_E$ (=E'(160)/E'(−40)) of the elastic modulus E'(160) at 160° C. to the elastic modulus E'(−40) at −40° C. is such that $R_E \geq 0.01$ and E'(−40) is 10 MPa or more and less than 1000 MPa, and the adhesive layer 12 of the film 1 for manufacturing a semiconductor part is bonded to back surfaces of the semiconductor parts 21 obtained by separating the semiconductor wafer 20 having a circuit formed thereon into segments (refer to FIG. 6).

Only any one of these evaluation methods may be performed, or both of them may be performed in combination. That is, after a predetermined evaluation is made for the semiconductor wafer 20, a predetermined evaluation can be further made for the semiconductor part 21. The contents of the evaluations are as described above.

By using the film 1 for manufacturing an electronic device of the present invention, the evaluation of an array-shaped electronic device can be made without changing the film 1 for manufacturing an electronic device for rebonding during manufacturing an electronic device. That is, an evaluation of the array-shaped electronic device 50 can be made in a temperature region of −40° C. or higher and 0° C. or lower, or 100° C. or higher and 160° C. or lower in a state in which the film 1 for manufacturing an electronic device includes a base layer 11 and an adhesive layer 12 disposed on one surface side of the base layer 11, in the base layer 11, the ratio $R_E$ (=E'(160)/E'(−40)) of the elastic modulus E'(160) at 160° C. to the elastic modulus E'(−40) at −40° C. is such that $R_E \geq 0.01$ and E'(−40) is 10 MPa or more and less than 1000 MPa, and the adhesive layer 12 of the film 1 for manufacturing an film for manufacturing an electronic device is bonded to a back surface of the array-shaped electronic device 50 (refer to FIG. 9).

Further, by using the film 1 for manufacturing an electronic device of the present invention, the evaluation of an electronic device can be made without changing the film 1 for manufacturing an electronic device for rebonding during manufacturing an electronic device. That is, an evaluation of the electronic device 51 can be made in a temperature region of −40° C. or higher and 0° C. or lower, or 100° C. or higher and 160° C. or lower in a state in which the film 1 for manufacturing an electronic device includes a base layer 11 and an adhesive layer 12 disposed on one surface side of the base layer 11, in the base layer 11, the ratio $R_E$ (=E'(160)/E'(−40)) of the elastic modulus E'(160) at 160° C. to the elastic modulus E'(−40) at −40° C. is such that $R_E \geq 0.01$ and E'(−40) is 10 MPa or more and less than 1000 MPa, and the adhesive layer 12 of the film 1 for manufacturing an electronic device is bonded to a back surface of the electronic device 51 (refer to FIG. 11).

Only any one of these evaluation methods may be performed, or both of them may be performed in combination. That is, after a predetermined evaluation is made for the array-shaped electronic device 50, a predetermined evaluation can be further made for the electronic device 51. The contents of the evaluations are as described above.

EXAMPLES

Hereinafter, the present invention will be specifically described by way of examples. In addition, the film for manufacturing a semiconductor part and the film for manufacturing an electronic device are collectively referred to as a film for manufacturing a part below.

(4) Manufacturing of Film for Manufacturing Part

Example 1

(1) Base Layer

As a base layer 11, a polyester-based them ° plastic elastomer (TPEE) film (manufactured by Du pont-Toray Co., Ltd., trade name "Hytrel 4777", melting point: 200° C.) having a thickness of 80 μm was used.

Using the base layer 11, the tensile elastic modulus E' was measured with a dynamic mechanical analysis (DMA) apparatus (product name: RSA-3, manufactured by TA Instruments Inc.). Specifically, a sample size was set to a width of 10 mm, a distance between chucks was set to 20 mm, and measurement was carried out from −50° C. to 200° C. under the conditions of a frequency of 1 Hz and a temperature raising rate of 5° C./min, and the tensile elastic modulus data at each temperature was read from the resulting data. That is, a value at −40° C. was defined as a tensile elastic modulus E'(−40), and a value at 160° C. was defined as a tensile elastic modulus E'(160). As a result of this, E'(−40) was 440 MPa, and E'(160) was 12 MP. Consequently, the ratio $R_E$ (=E'(160)/E'(−40)) was 0.03.

(2) Adhesive Layer

As an adhesive layer 12, a non-curable acrylic adhesive agent having a thickness of 10 μm was used.

(3) Lamination of Adhesive Layer on Base Layer

The adhesive layer 12 obtained in the above (2) was laminated on one surface of the base layer 11 obtained in the above (1) to obtain a film 1 for manufacturing a part of Example 1.

Using the obtained film 1 for manufacturing a part of Example 1, an adhesive force was measured by the following method according to JIS Z 0237. That is, the obtained film for manufacturing a part was formed into a test piece having a width of 25 mm, and the adhesive layer 12 of the film for manufacturing a part was bonded to a 4-inch silicon wafer while applying a pressure with a rubber roll of about 2 kg. Then, the test piece was left standing for 60 minutes in an environment of a temperature of 23° C. and a relative humidity of 50%. Thereafter, an adhesive force at the time when the test piece was peeled off from the silicon wafer at a peeling speed of 300 mm/min in a direction of 180°, was measured. The measurement of the adhesive force was performed twice, and an average value thereof was taken as "adhesive force" (N/25 mm). As a result of this, the adhesive force of
the film for manufacturing a part of Example 1 was 1.2 N/25 mm Example 2

As a base layer 11, the same polyester-based thermoplastic elastomer film (manufactured by Du pont-Toray Co., Ltd., trade name "Hytrel 4777", a melting point: 200° C.) as in Example 1 except for having a thickness of 150 μm, was used.

As an adhesive layer 12, a non-curable acrylic adhesive agent having a thickness of 10 μl, which was similar to that of Example 1, was used.

As with Example 1, the adhesive layer 12 was laminated on the base layer 11 to obtain a film 1 for manufacturing a part of Example 2. Using the obtained film for manufacturing a part of Example 2, the adhesive force measured in the same manner as in Example 1 was 1.2 N/25 mm Example 3

As a base layer 11, the same polyester-based thermoplastic elastomer film (manufactured by Du pont-Toray Co., Ltd., trade name "Hytrel 4777", melting point: 200° C.) as in Example 1 except for having a thickness of 150 μm, was used.

An ultraviolet curable acrylic adhesive agent self-manufactured was formed into a thickness of 10 μm as an adhesive layer 12.

As with Example 1, the adhesive layer 12 was laminated on the base layer 11 to obtain a film 1 for manufacturing a part of Example 3. Using the obtained film for manufacturing a part of Example 3, the adhesive force measured in the same manner as in Example 1 was 4.5 N/25 mm.

Comparative Example 1

As a base layer 11, a linear short chain branched polyethylene (PE) film (manufactured by Prime Polymer Co., Ltd., trade name "Evolue SP2040", melting point: 116° C.) having a thickness of 80 μm, was used.

Using the base layer 11, the tensile elastic modulus E'(−40) at −40° C. obtained by measuring in the same manner as in Example 1 was 520 MPa. On the other hand, E'(160) was unmeasurable at a temperature of 160° C. by break of the base layer. Consequently, the ratio $R_E$ (=E'(160)/E'(−40)) was less than 0.01.

As an adhesive layer 12, a non-curable acrylic adhesive agent having a thickness of 10 μm, which was similar to that of Example 1, was used.

As with Example 1, the adhesive layer 12 was laminated on the base layer 11 to obtain a film 1 for manufacturing a part of Comparative Example 1. Using the obtained film for manufacturing a part of Comparative Example 1, the adhesive force measured in the same manner as in Example 1 was 1.2 N/25 mm.

Comparative Example 2

As a base layer 11, a random polypropylene (PP) film (manufactured by Prime Polymer Co., Ltd., trade name "F327", melting point: 138° C.) having a thickness of 80 μm, was used.

Using the base layer 11, the tensile elastic modulus E'(−40) at −40° C. obtained by measuring in the same manner as in Example 1 was 1500 MPa. On the other hand, E'(160) was unmeasurable at a temperature of 160° C. by break of the base layer. Consequently, the ratio $R_E$ (=E'(160)/E'(−40)) was less than 0.01.

As an adhesive layer 12, a non-curable acrylic adhesive agent having a thickness of 10 μm, which was similar to that of Example 1, was used.

As with Example 1, the adhesive layer 12 was laminated on the base layer 11 to obtain a film 1 for manufacturing a part of Comparative Example 2. Using the obtained film for manufacturing a part of Comparative Example 2, the adhesive force measured in the same manner as in Example 1 was 1.2 N/25 mm Comparative Example 3

As a base layer 11, a polyvinyl chloride (PVC) film (manufactured by ACHILLES CORPORATION, trade name "Seiden Film", melting point: 95° C.) having a thickness of 80 μm, was used.

Using the base layer 11, the tensile elastic modulus E'(−40) at −40° C. obtained by measuring in the same manner as in Example 1 was 2000 MPa, and E'(160) was 0.5 MPa. Consequently, the ratio $R_E$ (=E'(160)/E'(−40)) was $2.5 \times 10^{-4}$ and less than 0.01.

As an adhesive layer 12, a non-curable acrylic adhesive agent having a thickness of 10 μm, which was similar to that of Example 1, was used.

As with Example 1, the adhesive layer 12 was laminated on the base layer 11 to obtain a film 1 for manufacturing a part of Comparative Example 3. Using the obtained film for manufacturing a part of Comparative Example 3, the adhesive force measured in the same manner as in Example 1 was 1.2 N/25 mm.

TABLE 1

| | | | Example | | | Comparative Example | | |
|---|---|---|---|---|---|---|---|---|
| | | | 1 | 2 | 3 | 1 | 2 | 3 |
| Film for Manufacturing Part | Base Layer | Material | | TPEE | | PE | PP | PVC |
| | | Thickness (μm) | 80 | 150 | 150 | 80 | 80 | 80 |
| | | $E'(-40)$ | | 440 | | 520 | 1500 | 2000 |
| | | $E'(160)$ | | 12 | | break | break | 0.5 |
| | | $R_E$ $E'(160)/E'(-40)$ | | 0.03 | | <0.01 | <0.01 | <0.01 |
| | Adhesive Layer | Curing Type | non-curing | non-curing | UV curing | non-curing | non-curing | non-curing |
| | | Adhesive Force (N/25 mm) | 1.2 | 1.2 | 4.5 | 1.2 | 1.2 | 1.2 |
| Evaluation | | Heat Resistance (test 1) | ○ | ○ | ○ | X | X | X |
| | | Adhesive Deposit (test 2) | ○ | ○ | ○ | ○ | ○ | ○ |

[2] Test Using Film for Manufacturing Part

The following two types of tests were performed using the films for manufacturing a part of Examples 1 to 4 and Comparative Examples 1 to 3.

(1) Test 1 (Evaluation of Heat Resistance)

A side of the base layer 11 of each of the films for manufacturing a part of Examples 1 to 4 and Comparative Examples 1 to 3 obtained in the above [1] was fixed, by suction, to a vacuum suction type wafer table (chuck table) set at 160° C., and the film for manufacturing a part was detached from the wafer table through vacuum break after a lapse of 10 minutes. In doing so, ease of detaching from the wafer table was rated according the following criteria, and the result of rating was shown in Table 1.

"○" . . . The film can be detached without difficulty.

"x" . . . Film weld to the wafer table is found and detaching is not easy.

(2) Test 2 (Evaluation of Adhesive Deposit)

A side of the adhesive layer 12 of each of the films for manufacturing a part of Examples 1 to 4 and Comparative Examples 1 to 3 obtained in the above [1] was bonded to a mirror surface of a silicon wafer of 4-inch size, a wafer surface was placed on a hot plate of 160° C. and held for 10 minutes, and then the hot plate was cooled. Subsequently, using a high-pressure mercury lamp, the film for manufacturing a part was irradiated with light having a wavelength of 365 nm so that a cumulative light quantity was 1080 mJ/cm$^2$, and then the film for manufacturing a part was peeled off from the silicon wafer. In doing so, an adhesive deposit to the silicon wafer was visually rated according to the following criteria, and the result of rating was shown in Table 1.

"○" . . . The adhesive deposit to the silicon wafer is not visually found.

"x" . . . The adhesive deposit to the silicon wafer is visually found.

[3] Effect of Examples

It is found that since the ratio $R_E$ in the base layer 11 of the film 1 for manufacturing a part is such that $R_E > 0.01$, a semiconductor part and an electronic device can be manufactured using a wafer table heated at 160° C. That is, by using the present film 1 for manufacturing a part, a film for manufacturing a part can be used commonly in an evaluation step accompanied with a temperature change, a segmenting step, and a pickup step, and this enables to reduce man-hours for rebonding the film to improve the productivity of a semiconductor part and an electronic device. Further, it is found from a comparison between Example 1 and Example 2 that the films for manufacturing a part of Examples show the same easiness to handle (hardness of a film at ordinary temperature, easiness of bonding, and the like) irrespective of film thicknesses, and became an easy-to-handle film for manufacturing a part in any Examples.

In addition, in the present invention, the invention is not limited to the above-mentioned specific Examples, and widely different Examples of this invention may be made within the scope of the invention according to the object and the use of the invention.

INDUSTRIAL APPLICABILITY

The film for manufacturing a semiconductor part, the method for manufacturing a semiconductor part, the film for manufacturing an electron device, and the method for manufacturing an electronic device of the present invention are widely used in uses of semiconductor part manufacturing and electronic device manufacturing. Particularly, these films and manufacturing methods of the present invention are suitably used in manufacturing parts with excellent productivity since when using the method for manufacturing a semiconductor part or the method for manufacturing an electronic device respectively including an evaluation step accompanied with a temperature change, a segmenting step and a pickup step, these films can be used commonly in these steps.

REFERENCE SIGNS LIST

1: film for manufacturing a semiconductor part, film for manufacturing an electronic device, 15: protecting member
11: base layer
12: adhesive layer
12a: surface of an adhesive layer (surface of an adhesive layer 12 that is exposed via an opening 71)
20: semiconductor wafer, 21; semiconductor part
30: sealing material
50: array-shaped electronic device, 51: electronic device
7: frame
7a: one surface of a frame
71: opening of a frame
8: probe card, 81: probe
91: stopper, 92: pushing-up member, 93: picking-up instrument
R1: protecting member forming step
R2: bonding step
R3: evaluation step (semiconductor wafer evaluation step, array-shaped electronic device evaluation step)

R4: segmenting step
R5: evaluation step (semiconductor part evaluation step, electronic device evaluation step)
R6: part-isolating step
R7: pickup step

The invention claimed is:

1. A method for manufacturing a semiconductor part comprising:
   a segmenting step of separating a semiconductor wafer into segments in a state in which an adhesive layer of a film for manufacturing a semiconductor part is bonded to a back surface of the semiconductor wafer having circuits formed thereon to obtain semiconductor parts; and
   a pickup step of separating the semiconductor parts from the adhesive layer,
   the method comprising an evaluation step of evaluating electrical properties of the semiconductor wafer or the semiconductor parts in a temperature region of 0° C. or lower, or 100° C. or higher prior to the pickup step,
   wherein the film for manufacturing a semiconductor part has a base layer and the adhesive layer disposed on one surface side of the base layer,
   wherein the ratio $R_E$ (=E'(160)/E'(−40)) of the elastic modulus E'(160) of the base layer at 160° C. to the elastic modulus E'(−40) of the base layer at −40° C. is such that $R_E \geq 0.01$, and the elastic modulus E'(−40) is 10 MPa or more and less than 1000 MPa, and
   wherein base layer includes a thermoplastic polyester-based elastomer and/or a thermoplastic polyamide-based elastomer.

2. The method for manufacturing a semiconductor part according to claim 1, wherein the base layer has a thickness of 50 μm or more and 200 μm or less.

3. The method for manufacturing a semiconductor part according to claim 1, wherein the adhesive layer has a thickness of 1 μm or more and 40 μm or less.

4. The method for manufacturing a semiconductor part according to claim 1, wherein the adhesive layer has an adhesive force of 0.1 to 10 N/25 mm which is measured according to JIS Z 0237.

5. The method for manufacturing a semiconductor part according to claim 1,
   wherein the thermoplastic polyester-based elastomer comprises a block copolymer having a hard segment and a soft segment, wherein the hard segment is a polyester component, and
   wherein the thermoplastic polyamide-based elastomer comprises a block copolymer having a hard segment and a soft segment, wherein the hard segment is a polyamide component.

6. A method for manufacturing an electronic device comprising:
   a segmenting step of separating an array-shaped electronic device into segments in a state in which an adhesive layer of a film for manufacturing a part is bonded to a back surface of the array-shaped electronic device provided with semiconductor parts sealed in an array configuration to obtain electronic devices; and
   a pickup step of separating the electronic device from the adhesive layer,
   the method comprising an evaluation step of evaluating electrical properties of the array-shaped electronic device or the electronic device in a temperature region of 0° C. or lower, or 100° C. or higher prior to the pickup step,
   wherein the film for manufacturing an electronic device has a base layer and the adhesive layer disposed on one surface side of the base layer,
   wherein the ratio $R_E$ (=E'(160)/E'(−40)) of the elastic modulus E'(160) of the base layer at 160° C. to the elastic modulus E'(−40) of the base layer at −40° C. is such that $RE \geq 0.01$, and the elastic modulus E'(−40) is 10 MPa or more and less than 1000 MPa, and
   wherein base layer includes a thermoplastic polyester-based elastomer and/or a thermoplastic polyimide-based elastomer.

7. The method for manufacturing an electronic device according to claim 6, wherein the base layer has a thickness of 50 μm or more and 200 μm or less.

8. The method for manufacturing an electronic device according to claim 6, wherein the adhesive layer has a thickness of 1 μm or more and 40 μm or less.

9. The method for manufacturing an electronic device according to claim 6, wherein the adhesive layer has an adhesive force of 0.1 to 10 N/25 mm which is measured according to JIS Z 0237.

10. The method for manufacturing a semiconductor part according to claim 6,
    wherein the thermoplastic polyester-based elastomer comprises a block copolymer having a hard segment and a soft segment, wherein the hard segment is a polyester component, and
    wherein the thermoplastic polyamide-based elastomer comprises a block copolymer having a hard segment and a soft segment, wherein the hard segment is a polyamide component.

* * * * *